(12) United States Patent
Nammi et al.

(10) Patent No.: US 11,533,065 B2
(45) Date of Patent: Dec. 20, 2022

(54) SYSTEM AND METHOD FOR DECODING ENCODED MESSAGES IN A WIRELESS COMMUNICATION SYSTEM

(71) Applicant: AT&T Intellectual Property I, L.P., Atlanta, GA (US)

(72) Inventors: Sairamesh Nammi, Kista (SE); Arunabha Ghosh, Austin, TX (US); Aditya Chopra, Austin, TX (US); Saeed Ghassemzadeh, Austin, TX (US)

(73) Assignee: AT&T Intellectual Property I, L.P., Atlanta, GA (US)

( * ) Notice: Subject to any disclaimer, the term of this patent is extended or adjusted under 35 U.S.C. 154(b) by 0 days.

(21) Appl. No.: 17/241,847

(22) Filed: Apr. 27, 2021

(65) Prior Publication Data

US 2021/0273656 A1    Sep. 2, 2021

Related U.S. Application Data

(63) Continuation of application No. 16/653,355, filed on Oct. 15, 2019, now Pat. No. 11,025,279.

(51) Int. Cl.
*H03M 13/25* (2006.01)
*H03M 13/11* (2006.01)
(Continued)

(52) U.S. Cl.
CPC ......... *H03M 13/251* (2013.01); *H03M 13/09* (2013.01); *H03M 13/098* (2013.01);
(Continued)

(58) Field of Classification Search
CPC .. H03M 13/251; H03M 13/09; H03M 13/098; H03M 13/1102; H03M 13/255; H03M 13/3715
See application file for complete search history.

(56) References Cited

U.S. PATENT DOCUMENTS

| | | | |
|---|---|---|---|
| 2012/0102378 A1 | 4/2012 | Matsumoto et al. | |
| 2016/0135194 A1* | 5/2016 | Kim | H04B 7/0626 370/329 |

(Continued)

*Primary Examiner* — Cynthia Britt
(74) *Attorney, Agent, or Firm* — Guntin & Gust, PLC; Andrew Gust

(57) ABSTRACT

Aspects of the subject disclosure may include, for example, obtaining a received channel-encoded data block having information bits, a transmitted error-check value, and redundant code bits. The redundant code bits correspond to a channel code applied to the received channel-encoded data block prior to transmission via a communication channel. A channel code type is identified and responsive to it being systematic, the information bits and the transmitted error-check value are obtained without decoding according to the channel code. The received channel-encoded data block is checked according to the transmitted error-check value to obtain a result. Responsive to the result not indicating an error, extracting the information bits without decoding the received channel-encoded data block according to the channel code. Responsive to the result indicating an error, decoding the received channel-encoded data block according to the channel code to obtain decoded information bits. Other embodiments are disclosed.

20 Claims, 14 Drawing Sheets

(51) Int. Cl.
*H03M 13/09* (2006.01)
*H03M 13/37* (2006.01)
(52) U.S. Cl.
CPC ..... *H03M 13/1102* (2013.01); *H03M 13/255* (2013.01); *H03M 13/3715* (2013.01)

(56) References Cited

U.S. PATENT DOCUMENTS

2017/0164263 A1\* 6/2017 Lindoff ................ H04L 45/121
2018/0175882 A1 6/2018 Hanham et al.
2021/0111740 A1 4/2021 Nammi et al.

\* cited by examiner

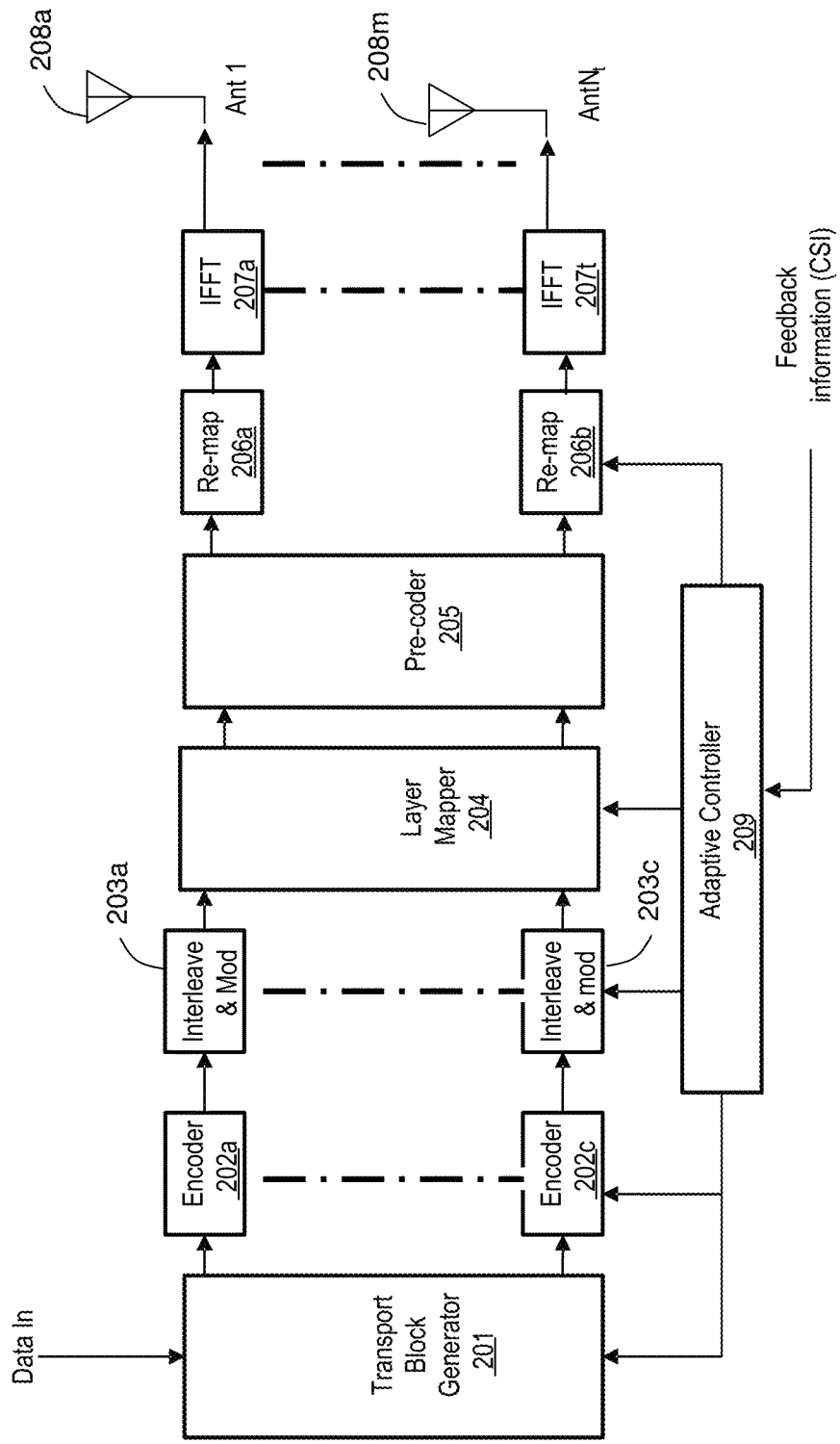

296

298

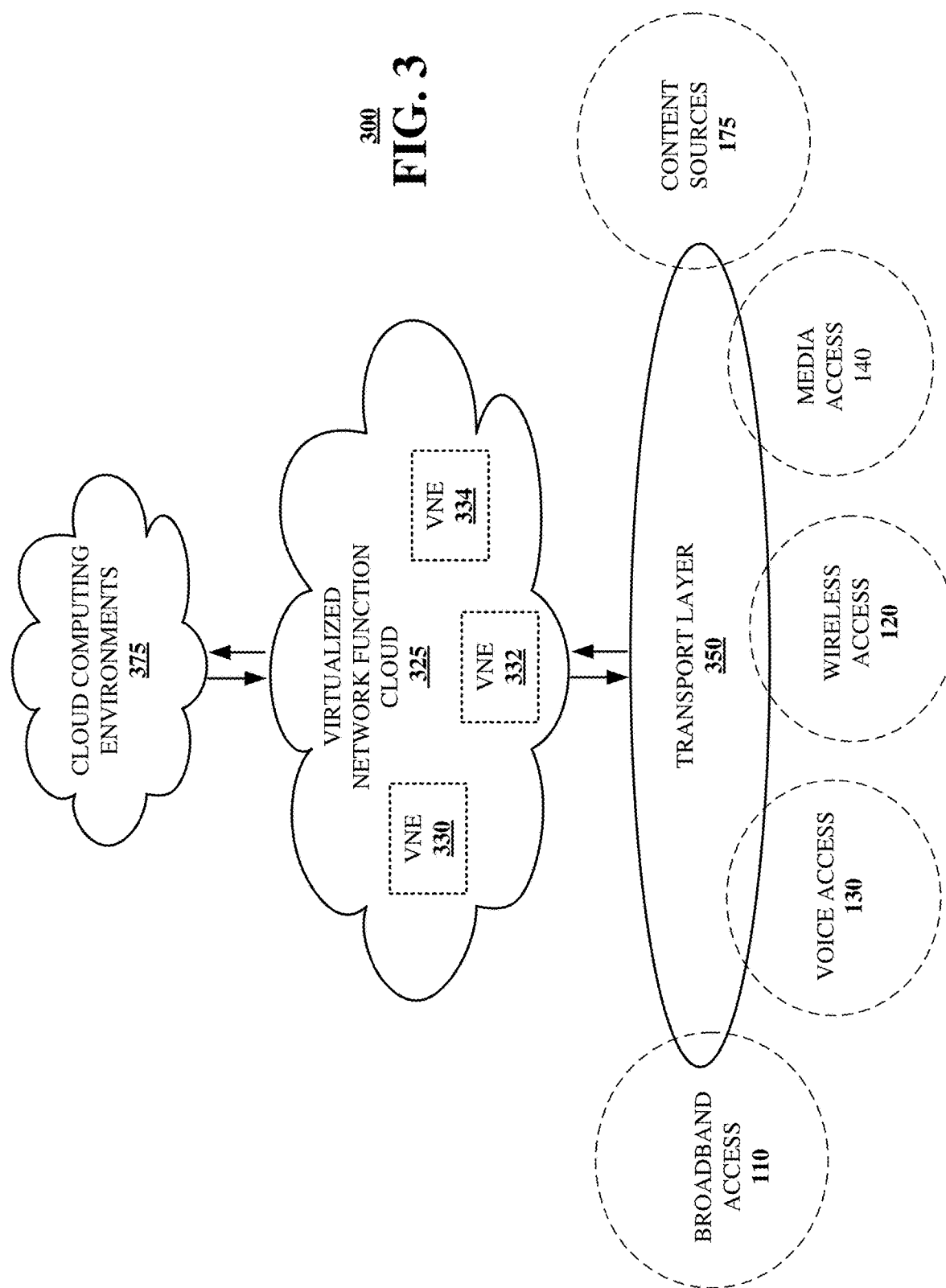

SYSTEM AND METHOD FOR DECODING ENCODED MESSAGES IN A WIRELESS COMMUNICATION SYSTEM

CROSS REFERENCE TO RELATED APPLICATIONS

This application is a continuation of U.S. patent application Ser. No. 16/653,355 filed on Oct. 15, 2019. All sections of the aforementioned application are incorporated herein by reference in their entirety.

FIELD OF THE DISCLOSURE

The subject disclosure relates to a system and method for decoding encoded messages in a wireless communication system.

BACKGROUND

Data communication link performance can be enhanced through an application of error correction codes. For example, forward error correction can be applied to one or more segments of information bits of a transport block to facilitate detection and correction of errors that may be encountered during transmission of the information segment(s) via a communication channel. Detection and/or correction of such errors promotes reliable communications.

In more detail, error correction schemes, such as forward error correction, determine parity bits that are combined with the information bits of each segment prior to channel encoding and subsequent transport as channel encoded packets via the communication channel. The additional parity bits protect the information bits when passed through the communication channel. For example, it is generally understood that a wireless communication channels exhibit adverse characteristics, such as average white Gaussian noise (AWGN) and/or multipath fading etc. These characteristics can introduce errors into the channel encoded packets that would otherwise impede reliable reception of the original information bits at a channel receiver.

There are many types of forward error correction codes that can be generally categorized as either systematic codes or non-systematic codes. Systematic codes can be characterized by their inclusion of original information bits, together with parity bits in each error-correction encoded transport block. Some examples of systematic codes include low density parity check (LDPC) codes, sometimes referred to as Gallagher codes. LDPC codes are a class of linear block codes in which a parity check matrix is sparse, i.e., having a low density of 1's. Iterative decoding of LDPC encoded blocks can be applied at a receiver with performance approaching a Shannon capacity limit.

Other codes include, without limitation, some convolutional codes, e.g., turbo codes and polar codes. In at least some instances, polar codes can achieve a symmetric capacity of arbitrary binary-input discrete memoryless channels under a successive cancellation decoding strategy.

BRIEF DESCRIPTION OF THE DRAWINGS

Reference will now be made to the accompanying drawings, which are not necessarily drawn to scale, and wherein:

FIG. 2A is a block diagram illustrating an example, non-limiting embodiment of a multiple input, multiple output (MIMO) downlink communication system functioning within the communication network of FIG. 1 in accordance with various aspects described herein.

FIG. 3 is a block diagram illustrating an example, non-limiting embodiment of a virtualized communication network in accordance with various aspects described herein.

DETAILED DESCRIPTION

Figure 1:
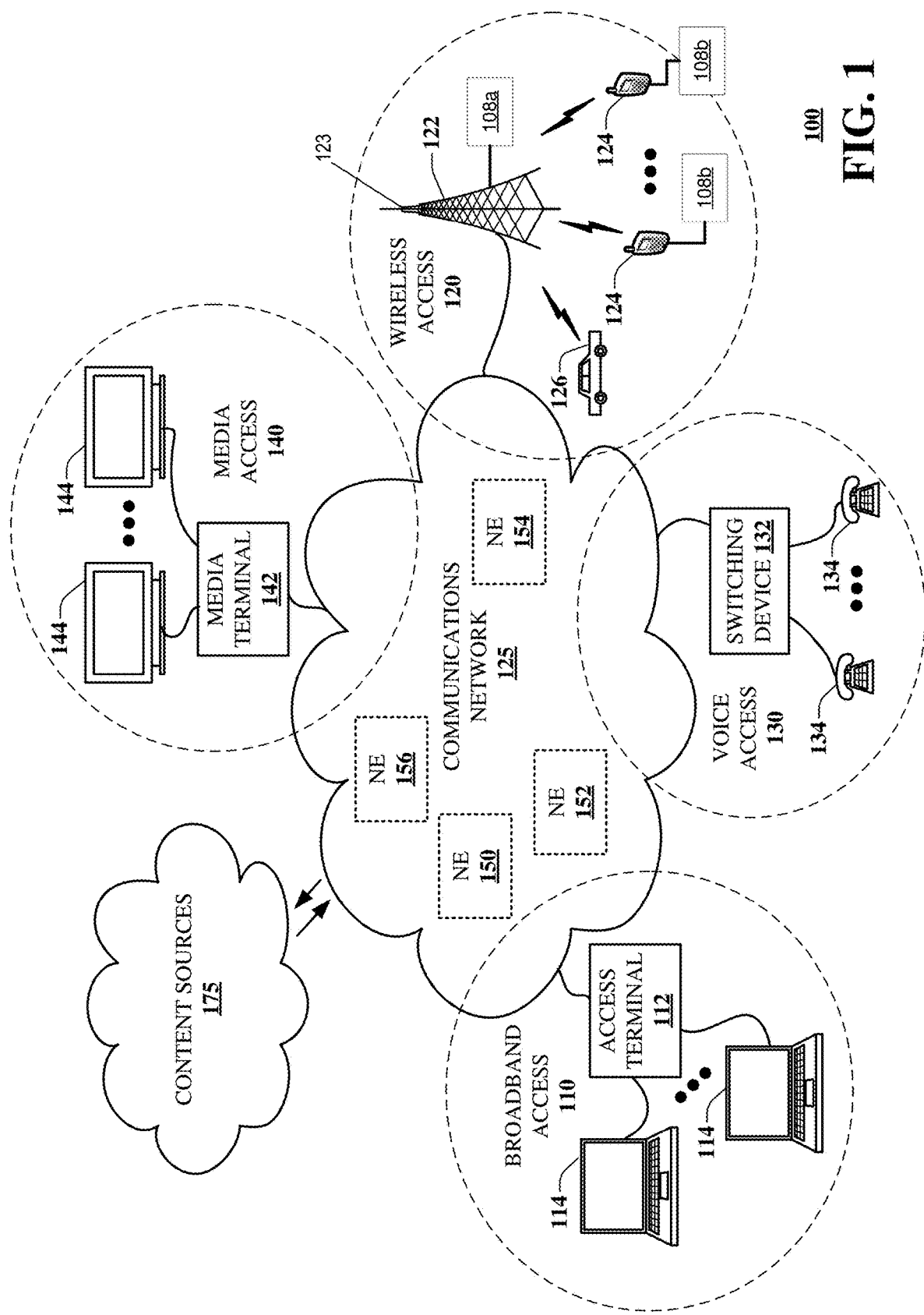
FIG. 1 is a block diagram illustrating an exemplary, non-limiting embodiment of a communications network in accordance with various aspects described herein.

The subject disclosure describes, among other things, illustrative embodiments for obtaining information bits from a received channel-encoded data block received via a communication channel, without decoding the received channel-encoded data block. In at least some embodiments, a channel decoder is temporarily disabled responsive to a determination that systematic channel encoding was applied to the data block prior to transmission, and upon a favorable error check of the received channel-encoded data block. In such instances, the information bits can be extracted from the received channel-encoded data block, without requiring a channel decoding of the received channel-encoded data block. It is understood that extracting information bits without requiring channel decoding can provide advantages, such as savings to one or more of power consumption, processing resources, memory. Other embodiments are described in the subject disclosure.

The illustrative techniques disclosed herein include receivers and/or processes implemented at communication receiver nodes adapted to decode received error correction encoded data based on a channel condition, including features of a transmitter, e.g., transmit power and/or a receiver, e.g., antenna gain, pre-amplification, noise figure, SINR and the like. Alternatively or in addition, the illustrative techniques disclosed herein include receivers and/or processes implemented at communication receivers for selectively decoding receive data when encoded by a systematic code.

One or more aspects of the subject disclosure include a process, including receiving, by a processing system including a processor, a channel encoded data block to obtain a received channel encoded data block. The received channel encoded data block includes information bits, a transmitted error-check value, and redundant code bits. The redundant code bits correspond to a channel code applied prior to transmission of the channel encoded data block via a communication channel. The channel code is determined, by the processing system. Responsive to the channel code being a systematic code, the information bits and the transmitted error-check value are obtained, by the processing system, from the received channel encoded data block without decoding the received channel encoded data block according to the channel code. An error check of the received channel encoded data block is performed according to the transmitted error-check value to obtain an error-check result. Responsive to the error-check result indicating a pass, the information bits obtained without decoding the received channel encoded data block according to the channel code are forwarded by the processing system. Responsive to the error-check result indicating a failure, the received channel encoded data block is decoded by the processing system according to the channel code to obtain decoded received information bits.

One or more aspects of the subject disclosure include a device, having a processing system including a processor and a memory that stores executable instructions. The instructions, when executed by the processing system, facilitate performance of operations. The operations include, obtaining a received channel encoded data block transmitted via a communication channel, wherein the received channel encoded data block comprises information bits, a transmitted error-check value, and redundant code bits. The redundant code bits corresponds to a channel code applied to the received channel encoded data block prior to transmission via a communication channel. The channel code is identified and responsive to it being a systematic code, the information bits and the transmitted error-check value are obtained from the received channel encoded data block without decoding the received channel encoded data block according to the channel code. An error check of the received channel encoded data block is performed according to the transmitted error-check value to obtain an error-check result.

One or more aspects of the subject disclosure include a non-transitory, machine-readable medium, including executable instructions that, when executed by a processing system including a processor, facilitate performance of operations. The operations include obtaining a received channel encoded data block including information bits, a transmitted error-check value, and redundant code bits. The redundant code bits correspond to a channel code applied to the received channel encoded data block prior to transmission via a communication channel. The channel code is identified to obtain a channel code type. Responsive to the channel code type being a systematic channel code type the information bits and the transmitted error-check value are obtained from the received channel encoded data block without decoding the received channel encoded data block according to the channel code. The received channel encoded data block is error checked according to the transmitted error-check value to obtain an error-check result.

The examples disclosed herein facilitate decoding data received over a communication channel when encoded by a systematic forward error correction code, such as LDPC code for 5G wireless communication systems. According to at least some of the illustrative examples, the receiver may first obtain information about performance of the communication channel, such as a long term signal to noise ratio of the operating link. The receiver can be adapted to avoid at least some decoding operation of the systematic forwarded error correction, e.g., LDPC, codes. Alternatively or in addition a receiver can be adapted to apply a modified decoding algorithm in which the receiver first evaluates or checks received information bits from the coded bits. In at least some of the examples disclosed herein, the checking involves determining a CRC for the information bits and comparing it to a CRC value provided in the transport block to determine a CRC pass or fail. If the CRC performed at the receiver fails, the receiver can passes the received, encoded transport block to an LDPC decoder for decoding. However, if the CRC performed at the receiver indicates a pass, then the information bits can be extracted from the encoded transport block without performing a decoding operation.

Advantages realized by the techniques disclosed herein include, without limitation a significant reduction in the number of computations by avoiding the decoding operation for at least some transport blocks under at least some communication channel conditions. For example, in at least some embodiments, a receiver under favorable communication channel conditions can switch off its decoder for at least some if not most of the time, e.g., preserving these resources for other operations. Beneficially, by application of the disclosed techniques, the communication channel and receiver throughput is not impacted, while at the same time offering a significant reduction in power consumption at the receiver.

According to some embodiments, as disclosed in U.S. patent application Ser. No. 15/407,246, entitled "Single Codeword, Multi-Layer Serial Interference Cancellation (SIC) for Spatial Multiplexing," filed on Jan. 16, 2017, now U.S. Pat. No. 10,050,688, incorporated herein by reference in its entirety, a communications device can be operated to support MIMO reception over a wireless channel. First and second data blocks, e.g., transport blocks, can be received respectively using first and second reception layers during a first Transmission Time Interval (TTI) for rank two reception. A first Hybrid Automatic Repeat Request (HARQ) process can be mapped to the first transport block of the first reception layer for the first transmission time interval and also to the second transport block of the second reception layer for the first TTI. Third, fourth, and fifth transport blocks can be received respectively using the first and second reception layers and using a third reception layers during a second TTI for rank three reception. The first HARQ process can be mapped to the third transport block of the first reception layer for the second TTI and the first HARQ process can be mapped to the fourth and fifth transport blocks of the second and third reception layers for the second TTI. The process can be repeated in a like manner for applications having ranks greater than four.

Mapping the first HARQ process to the first and second transport blocks of the first TTI can include transmitting an acknowledgment (ACK) message to the radio access network responsive to successfully decoding both of the first and second transport blocks and transmitting a non-acknowledgment (NAK) message to the radio access network responsive to failure decoding one or more of the first and second transport blocks. Where more than two transport blocks are processed according to the first HARQ process, an ACK is provided when all transport blocks have been successfully decoded at the receiver, otherwise, a NAK is provided.

In at least some embodiments, a precoding vector can be selected responsive to success and/or failure decoding the multiple transport blocks, and an identification of the selected precoding vector can be transmitted to a radio access network.

The processor can be configured to transmit multiple transport blocks through a transceiver using multiple transmission layers during a first TTI. The number of layers can be determined according to a rank of the MIMO system, e.g., being less than or equal to the rank. A common HARQ process, e.g., identified by the same HARQ process identifier (ID), can be associated with each transport block of the multiple transport blocks of the multiple layers for the first TTI.

For purposes of illustration and explanation only, these and other embodiments of disclosed concepts are described herein in the context of operating in a RAN that communicates over radio communication channels with wireless terminals (also referred to as UEs). It will be understood, however, that present disclosed concepts are not limited to such embodiments and can be embodied generally in any type of communication network. As used herein, a wireless terminal (also referred to as a UE) can include any device that receives data from a communication network, and can include, but is not limited to, a mobile telephone ("cellular" telephone), laptop/portable computer, pocket computer, hand-held computer, desktop computer, and more generally, any device capable of machine-to-machine communications, e.g., Internet of Thigs (IoT).

In some embodiments of a RAN, several base stations can be connected (e.g., by landlines or radio channels) to a radio network controller (RNC). The radio network controller, also sometimes termed a base station controller (BSC), supervises and coordinates various activities of the plural base stations connected thereto. The radio network controller is typically connected to one or more core networks.

The Universal Mobile Telecommunications System (UMTS) is a third generation mobile communication system, which evolved from the Global System for Mobile Communications (GSM), and is intended to provide improved mobile communication services based on Wideband Code Division Multiple Access (WCDMA) technology. UTRAN, short for UMTS Terrestrial Radio Access Network, is a collective term for the Node B's and Radio Network Controllers which make up the UMTS radio access network. Thus, UTRAN is essentially a radio access network using wideband code division multiple access for UEs.

The 3GPP has undertaken to further evolve the UTRAN and GSM based radio access network technologies. In this regard, specifications for the Evolved Universal Terrestrial Radio Access Network (E-UTRAN) are ongoing within 3GPP. The Evolved Universal Terrestrial Radio Access Network (E-UTRAN) comprises the Long Term Evolution (LTE) and System Architecture Evolution (SAE).

Note that although terminology from 3GPP LTE/LTE-Advanced is used in this disclosure to exemplify embodiments of disclosed concepts, this should not be seen as limiting the scope of the disclosed concepts to only these systems. Other wireless systems, including fifth generation LTE, sometimes referred to as "5G", WCDMA (Wideband Code Division Multiple Access), WiMax (Worldwide Interoperability for Microwave Access), UMB (Ultra Mobile Broadband), HSDPA (High-Speed Downlink Packet Access), GSM (Global System for Mobile Communications), etc., can also benefit from exploiting embodiments of concepts disclosed herein.

Also note that terminology such as base station (also referred to as eNodeB or Evolved Node B) and wireless terminal (also referred to as UE or User Equipment) should be considering non-limiting and does not imply a certain hierarchical relation between the two. In general a base station (e.g., an "eNodeB") and a wireless terminal (e.g., a "UE") can be considered as examples of respective different communications devices that communicate with each other over a wireless radio channel. While embodiments discussed herein can focus on wireless transmissions in a downlink from an eNodeB to a UE, embodiments of disclosed concepts can also be applied, for example, in the uplink.

Referring now to FIG. 1, a block diagram is shown illustrating an example, non-limiting embodiment of a communications network 100 in accordance with various aspects described herein. For example, communications network 100 can facilitate in whole or in part a simplified processing of received channel-encoded data blocks under certain favorable conditions. For example, information bits can be extracted from a received channel-encoded data block without requiring any decoding, responsive to a favorable error check result, e.g., a favorable CRC, of the received channel-encoded data block. In at least some embodiments, a channel decoder is temporarily disabled responsive to a determination that systematic channel encoding was applied to the data block prior to transmission, and upon a favorable error check of the received channel-encoded data block. In particular, a communications network 125 is presented for providing broadband access 110 to a plurality of data terminals 114 via access terminal 112, wireless access 120 to a plurality of mobile devices 124 and vehicle 126 via base station or access point 122, voice access 130 to a plurality of telephony devices 134, via switching device 132 and/or media access 140 to a plurality of audio/video display devices 144 via media terminal 142. In addition, communication network 125 is coupled to one or more content sources 175 of audio, video, graphics, text and/or other media. While broadband access 110, wireless access 120, voice access 130 and media access 140 are shown separately, one or more of these forms of access can be combined to provide multiple access services to a single client device (e.g., mobile devices 124 can receive media content via media terminal 142, data terminal 114 can be provided voice access via switching device 132, and so on).

In at least some embodiments, the base station or access point 122 is configured with a receive processor 108a that implements a simplified processing of received channel-encoded data blocks under certain favorable conditions. For example, receive processor 108a distinguishes received channel-encoded data blocks that employ a systematic encoding from received channel-encoded data blocks that employ a non-systematic encoding. The receive processor 108a can be adapted to obtain information bits from the received systematically encoded data blocks, under favorable reception conditions, without requiring a decoding of the received channel-encoded data blocks. In some embodiments, favorable reception conditions include a favorable comparison of an error check result to an error check value obtained from the received systematically encoded data block, such as a favorable CRC. Alternatively or in addition, favorable reception conditions include a favorable link a characteristic of the communication link. In at least some embodiments, the favorable link characteristic can be determined according to a comparison of a link characteristic value to a reference value. The reference value can include a threshold or offset. Without limitation, the link characteristic can include one or more of a signal-to-interference-plus-noise (SINR) value, a path loss, a relative distance, e.g., to a mobile device 124, a transmit power level of the mobile device 124, a noise measurement result, a noise estimate, and the like.

In at least some embodiments, a channel decoder of the receive processor 108a is temporarily disabled responsive to a determination that systematic channel encoding was applied to the data block prior to transmission, and upon a favorable error check of the received channel-encoded data block.

Alternatively or in addition, one or more of the mobile devices 124 can be configured with a receive processor 108b that implements a simplified processing of received channel-encoded data blocks under certain favorable conditions, according to the previous examples of the access point 122 receive processor 108a.

The communications network 125 includes a plurality of network elements (NE) 150, 152, 154, 156, etc., for facilitating the broadband access 110, wireless access 120, voice access 130, media access 140 and/or the distribution of content from content sources 175. The communications network 125 can include a circuit switched or packet switched network, a voice over Internet protocol (VoIP) network, Internet protocol (IP) network, a cable network, a passive or active optical network, a 4G, 5G, or higher generation wireless access network, WIMAX network, UltraWideband network, personal area network or other wireless access network, a broadcast satellite network and/or other communications network.

In various embodiments, the access terminal 112 can include a digital subscriber line access multiplexer (DSLAM), cable modem termination system (CMTS), optical line terminal (OLT) and/or other access terminal. The data terminals 114 can include personal computers, laptop computers, netbook computers, tablets or other computing devices along with digital subscriber line (DSL) modems, data over coax service interface specification (DOCSIS) modems or other cable modems, a wireless modem such as a 4G, 5G, or higher generation modem, an optical modem and/or other access devices.

In various embodiments, the base station or access point 122 can include a 4G, 5G, or higher generation base station, an access point that operates via an 802.11 standard such as 802.11n, 802.11ac or other wireless access terminal. The mobile devices 124 can include mobile phones, e-readers, tablets, phablets, wireless modems, and/or other mobile computing devices.

In various embodiments, the switching device 132 can include a private branch exchange or central office switch, a media services gateway, VoIP gateway or other gateway device and/or other switching device. The telephony devices 134 can include traditional telephones (with or without a terminal adapter), VoIP telephones and/or other telephony devices.

In various embodiments, the media terminal 142 can include a cable head-end or other TV head-end, a satellite receiver, gateway or other media terminal 142. The display devices 144 can include televisions with or without a set top box, personal computers and/or other display devices.

In various embodiments, the content sources 175 include broadcast television and radio sources, video on demand platforms and streaming video and audio services platforms, one or more content data networks, data servers, web servers and other content servers, and/or other sources of media.

In various embodiments, the communications network 125 can include wired, optical and/or wireless links and the network elements 150, 152, 154, 156, etc., can include service switching points, signal transfer points, service control points, network gateways, media distribution hubs, servers, firewalls, routers, edge devices, switches and other network nodes for routing and controlling communications traffic over wired, optical and wireless links as part of the Internet and other public networks as well as one or more private networks, for managing subscriber access, for billing and network management and for supporting other network functions.

To meet the huge demand for data centric applications, $3^{rd}$ Generation Partnership Protocol (3GPP) extended the current 4G standards to 5G also called as New Radio (NR) access. The following provide example requirements for 5G networks:

Data rates of several tens of megabits per second should be supported for tens of thousands of users;
1 gigabit per second to be offered simultaneously to tens of workers on the same office floor;
Several hundreds of thousands of simultaneous connections to be supported for massive sensor deployments;
Spectral efficiency should be significantly enhanced compared to 4G
Coverage should be improved;
Signaling efficiency should be enhanced; and
Latency should be reduced significantly compared to LTE.

In a practical system such as 5G New Radio (NR), 3GPP Long Term Evolution (LTE)/LTE-Advanced, High-Speed-Downlink-Packet-Access (HSDPA), etc. CRC bits are appended before a channel encoder at the transmitter and an error check is performed after a channel decoder of a receiver to determine whether a packet, e.g., a transport block or portion thereof, is received correctly or not.

In some embodiments the non-limiting term radio network node or simply network node is used and it refers to any type of network node serving UE and/or connected to other network node or network element or any radio node from where UE receives signal. Examples of radio network nodes are gNode B, Node B, base station (BS), multi-standard radio (MSR) radio node such as MSR BS, eNode B, network controller, radio network controller (RNC), base station controller (BSC), relay, donor node controlling relay, base transceiver station (BTS), access point (AP), transmission points, transmission nodes, RRU, RRH, nodes in distributed antenna system (DAS) etc., system.

In some embodiments the non-limiting term user equipment (UE) is used and it refers to any type of wireless device communicating with a radio network node in a cellular or mobile communication system. Examples of UE are target device, device to device (D2D) UE, machine type UE (MTC) or UE capable of machine to machine (M2M) communication, PDA, iPAD, Tablet, mobile terminals, smart phone, laptop embedded equipped (LEE), laptop mounted equipment (LME), USB dongles etc.

The embodiments are described in particular for operation of NR, E-UTRA/LTE/LTE-A, UTRA/HSPA FDD systems. The embodiments are however applicable to any RAT or multi-RAT system where the UE operates using MIMO, e.g., LTE TDD, GSM/GERAN, Wi Fi, WLAN, WiMax, CDMA2000, LTE-NX, Massive MIMO systems etc.

The embodiments are applicable to single carrier as well as to multicarrier (MC) or carrier aggregation (CA) operation of the UE in conjunction with MIMO in which the UE is able to receive and/or transmit data to more than one serving cells using MIMO. The term carrier aggregation (CA) is also called (e.g., interchangeably called) "multi-carrier system", "multi-cell operation", "multi-carrier operation", "multi-carrier" transmission and/or reception.

FIG. 2A is a block diagram illustrating an example, non-limiting embodiment of a multiple input, multiple output (MIMO) downlink communication system 200 functioning within the communication network of FIG. 1 in accordance with various aspects described herein. In particular, the MIMO downlink communication system 200 includes elements/functionalities of a transmit portion of a wireless terminal processor, e.g., the processor 108a of base station processor 122 (FIG. 1), supporting an example HARQ process/codeword MIMO with a number "c" of channel encoders 202a . . . 202c, generally 202) and up to rank "c" MIMO downlink transmission according to some embodiments. In at least some embodiments, a rank "c" can be an integer number that is less than or equal to a minimum of the number of transmit antennas "Nt" and the number of receive antenna "Nr". Namely, c Minimum (Nt, Nr).

The channel encoders 202 can provide for up to "c" streams of transport data blocks TB1, TB2 . . . TBc, with symbols of one data input stream for the wireless terminal 122 being mapped to as many as "c" different data streams. As shown, the downlink communication system 200 can include a transport data block generator 201, a number of channel encoders 202, a number of modulators 203a . . . 203c, generally 203, a layer mapper 204 and a layer pre-coder 205. The transport block generator 201 can include a number of individual transport block generators, e.g., a number "c" transport block generators, TB1, TB2 . . . TBc, each processing a respective transport block. In at least some embodiments, the downlink communication system 200 can include one or more spreader/scramblers, e.g., one for each antenna output of the pre-coder 205.

In at least some embodiments, the modulators 203 include interleavers, e.g., referred to as interleaver/modulators 203. The layer mapper 204 can be configured to map resulting symbols of the "c" streams to as many as "c" different MIMO layers (streams) X1 . . . Xc. The downlink communication system 200 can include an adaptive controller 209 that can be configured to control one or more of the transport data block generator 201, the channel encoder 202, the modulator 203, the layer mapper 204, and/or the layer pre-coder 205. In more detail, such control by the adaptive controller 209 can be responsive to Channel Quality Information (CQI) received as feedback from the wireless terminal 124 (FIG. 1). Accordingly, symbols generated responsive to one or more data codewords generated by the channel encoders 202 using different channel coding (e.g., determined by adaptive controller 209 responsive to feedback from a wireless terminal 124) can be interleaved and distributed (mapped) to "c" different MIMO layers. A data codeword CW generally refers to a transport data block, or portion thereof, with additional channel coding and/or parity and/or CRC bits.

In some embodiments, the encoders 202 apply a channel coding to segments of information, e.g., information blocks. The channel coding can include an error correction or error correcting code. It is understood that such error correction codes can be applied to control errors in transmission of data over unreliable or noisy communication channels. In general, the sender, e.g., the encoder 202, encodes the message with redundant information. The redundancy allows a receiver to detect a limited number of errors that may occur within a transmitted message, often without retransmission of the message. The channels codes can be classified generally into systematic codes and non-systematic channel codes. Examples of systematic codes include, without limitation, linear codes, such as low-density parity-check (LDPC) codes.

As disclosed herein, the concept of a codeword is generalized to include a logical codeword that corresponds to more than one transport data blocks, each having channel coding applied, respectively, and/or parity and/or CRC bits. The resulting channel encoded blocks or words with parity and/or CRC bits can be treated as a single logical codeword.

The data codeword, e.g., the single logical codeword, can be interleaved and/or then split between different MIMO layers. According to some embodiments discussed herein, the layer mapper 204 can perform a one-to-one mapping.

A processor 108a of the base station 122, for example, can receive input data, e.g., from a mobility core network, from another base station, and the like, for transmission to a wireless terminal 124, and the transport data block generator 201 (including transport data block data generators TB1, TB2, . . . TBc) can provide a single stream of data blocks (for rank 1 transmissions) or separate the input data into a number of different streams of data blocks, e.g., for rank 2, rank 3, and so on.

For rank two transmissions (providing two MIMO layers/streams), the transport data block generator 201 can generate a first layer/stream of transport data blocks (including individual transport data blocks), and a second layer/stream of transport data blocks. For higher order ranks, the transport data block generator 201 generates additional layers/streams/of transport data blocks.

The channel encoders 202 can encode the respective stream/streams of data blocks generated by the transport data block generator 201 to provide respective streams of channel-encoded codewords, for example, using forward error correcting codes, such as turbo coding, convolutional coding, etc. Moreover, in at least some embodiments, coding characteristics (e.g., coding rates) applied by the individual channel encoders 202 can be separately determined by the adaptive controller 209, responsive to feedback from the wireless terminal 124 (e.g., CQI regarding the downlink channel). For rank two transmissions, the channel encoder 202 can generate two streams of channel-encoded codewords responsive to respective streams of transport blocks using two of the channel encoders 202. Additional channel encoders 202 can be applied in a like manner to accommodate higher-order ranks including data to be transmitted during a same TFRE.

The interleaver/modulators 203 can interleave and/or modulate the stream/streams of channel encoded codewords generated by the channel encoders 202 to provide respective streams of unmapped channel-encoded symbol blocks. For rank two transmissions, the interleaver/modulators 203 can generate two streams of unmapped symbol blocks responsive to respective streams of channel-encoded codewords, and so on for higher-order ranks. The interleaver/modulators 202 can apply modulation orders responsive to or otherwise based on input from the adaptive controller 209, e.g., determined based on CQI feedback from the wireless terminal 124.

In addition, each interleaver/modulator 203 can interleave data of two or more data codewords of a stream so that two or more consecutive unmapped symbol blocks of a respective stream include symbols representing data of the two or more consecutive channel-encoded codewords. For example, data of consecutive channel-encoded codewords of a first channel-encoded codeword stream can be interleaved and modulated to provide consecutive unmapped symbol blocks of a first stream of symbols. Similarly, data of consecutive channel-encoded codewords of the second channel-encoded codeword stream can be interleaved and modulated to provide consecutive unmapped symbol blocks of the second stream of symbols. Likewise, data of consecutive channel-encoded codewords of a third channel-encoded codeword stream can be interleaved and modulated to provide consecutive unmapped symbol blocks of a third symbol stream, and so on for higher order ranks.

In at least some embodiments, symbols of streams of unmapped symbol blocks can be treated as symbols of a single logical code word, LCW. The single logical codeword can be mapped to one or more streams of mapped symbol blocks X1, X2 . . . Xc (for respective MIMO transmission layers), for example, using a one-to-one mapping. While one-to-one mapping is discussed by way of example, other mappings can be used provided that the mapping function of the layer mapper 204 is known to both base station 102a and wireless terminal 102b.

In at least some embodiments, the downlink communication system 200 includes a spreader/scrambler, e.g., including a separate spreader/scrambler for each mapped symbol stream provided by the layer mapper 204. The spreader/scrambler can generate a respective stream of spread symbol blocks Y1, Y2 . . . Yc, e.g., using a Walsh code, or the like. The pre-coder 205 can apply a MIMO precoding vector, e.g., by applying precoding weights, of the appropriate rank. In at least some embodiments, the precoding is based on wireless terminal feedback as interpreted by the adaptive controller 209. The precoding can be applied to the streams of spread symbol blocks for transmission through a transmitter/receiver or transceiver 124 and antennas 208a . . . 208t, generally 208, of the antenna array 123 (FIG. 1).

The processor 108a of the base station 122 can support a single HARQ process MIMO with up to "c" channel encoders 202 generating respective channel-encoded codewords CW1'-CWc'. Using feedback from the wireless terminal 124 (indicated by "feedback information (CSI)"), the adaptive controller 209 can choose one or more of a transport block length, a modulation order, and/or a coding rate, e.g., used by the transport block generator 202, the encoder 202, and/or the interleaver/modulator 203). The adaptive controller 209 can also generate precoding weight information used by the layer pre-coder 205. Even though the encoder 202 includes up to "c" channel encoders, the wireless terminal 108 can only provide feedback information for a maximum of one encoded logical codeword, based on up to "c" transport block channel-encoded codewords.

At the wireless terminal 124, operations of the processor 108b can mirror operations of the processor 108a of the base station 122 and/or the downlink communications system 200, when receiving the MIMO downlink communications transmitted by the base station 122. More particularly, elements/functionalities of the wireless terminal processor 108b are illustrated in the example computing environment 400 of FIG. 4, the example mobile platform 510 of FIG. 5, and/or the example communication device 600 of FIG. 6, e.g., mirroring elements/functionalities of the processor 108a of the base station 122 discussed above with reference to FIG. 3.

Figure 2B:
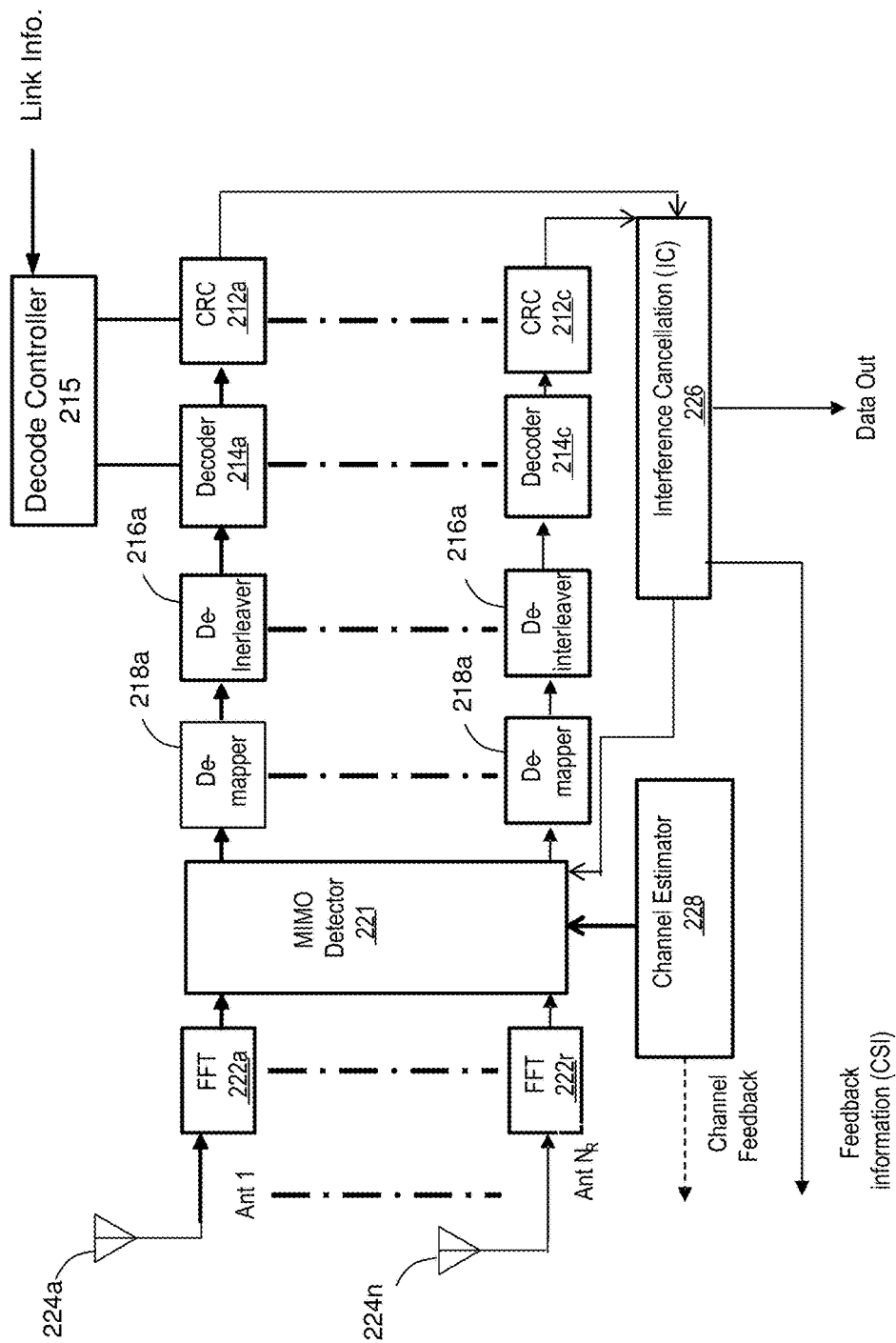
FIG. 2B is a block diagram illustrating an example, non-limiting embodiment of a receiver system adapted for communicating with the communication system of FIG. 2A and functioning within the communication network of FIG. 1 in accordance with various aspects described herein.

FIG. 2B is a block diagram illustrating an example, non-limiting embodiment of a receiver system 210 adapted for communicating with the communication system of FIG. 2A and functioning within the communication network of FIG. 1 in accordance with various aspects described herein. The radio signals can be received through MIMO antenna elements 224a . . . 224n, generally 224, of a MIMO antenna array 123 and transceiver of the base station 122 (FIG. 1). The receiver system 210 can include one or more FFT processors 222a . . . 222n, generally 222, e.g., one for each antenna element 224. The receiver system 210 can include a MIMO detector 221 in communication between the FFT processors 222 and one or more de-mappers 218a . . . 218c, generally 218. The receiver system 210 can further include one or more de-interleavers 216a . . . 216c, generally 216, one or more layer decoders 214a . . . 214c, generally 214, and one or more CRC processors 212a . . . 212c, generally 212. The de-interleaver(s) 216 are in communication between the de-mappers 218 and the layer decoders 214, and the decoders 214 are in further communication between the de-interleavers 216 and the CRC processors 212.

The radio signals can be decoded by the layer decoders 214, using a MIMO decoding vector to generate a number of MIMO decoded symbol layers X1', X2', X3', and/or Xc' depending on a MIMO rank used for transmission/reception. The layer decoders 214 can use a decoding vector corresponding to the precoding vector used by the base station 122. The layer decoders 214 can generate a single decoded symbol layer X1' for rank 1 reception, two decoded symbol layers X1' and X2' for rank 2 reception, and so on for higher-order rank transmissions. The layer decoder 214 can thus perform a converse of operations performed by the layer precoder 205 (FIG. 2A) and spreader/scrambler, when used, of the base station 122. The layer decoder 214 can perform functionalities of a MIMO detector (corresponding to a converse of layer precoder 205) and of dispreading/descrambling blocks for each data stream/layer (corresponding to a converse of spreader/scrambler). Layer de-mappers 218a . . . 218c, generally 218, can function as a converse of the layer mapper 204 (FIG. 2A) to de-map decoded symbol layers X1', X2' . . . and/or Xc' to respective unmapped symbol layers D1', D2' . . . and/or Dc' according to the transmission rank.

For rank one reception, the layer de-mapper 218 can de-map symbols of decoded symbol layer X1' blocks directly to symbols of unmapped symbol layer D1' blocks, demodulator/de-interleaver DM-1 can demodulate/de-interleave unmapped symbol layer blocks to provide data codewords of data codeword stream CW1', and channel decoder CD1 can decode data codewords of data codeword stream CW1' to provide transport blocks of stream B1'. A transport block generator can then pass transport blocks of stream B1' as a data stream. During rank one reception, demodulators/de-interleavers DM2, DM3, and DM4 and channel decoders CD2, CD3, and CD4 can be unused.

In at least some embodiments, the base station or access point 122 is configured with a receive processor 108a that implements a simplified processing of received channel-encoded data blocks under certain favorable conditions. The receive processor 108a can include one or more features of the example receiver system 210. For example, receiver system 210 includes a decode controller 215 adapted to evaluate received channel-encoded data blocks to distinguish received channel-encoded blocks that employ a systematic encoding from received channel-encoded data blocks that employ a non-systematic encoding. The receiver system 210 can be adapted to obtain information bits from the received systematically encoded data blocks, under favorable reception conditions, without requiring a decoding of the received channel-encoded data blocks. For example, the decode controller 215 can control operation of one or more of the decoder 214 or the CRC 212 to control whether decoding is applied or not applied. In some embodiments, favorable reception conditions include a favorable comparison of an error check result to an error check value obtained from the received systematically encoded data block, such as a favorable CRC. Alternatively or in addition, favorable reception conditions include a favorable link a characteristic of the communication link. In at least some embodiments, the favorable link characteristic can be determined according to a comparison of a link characteristic value to a reference value. The reference value can include a threshold or offset. Without limitation, the link characteristic can include one or more of a signal-to-interference-plus-noise (SINR) value, a path loss, a relative distance, e.g., to a mobile device 124, a transmit power level of the mobile device 124, a noise measurement result, a noise estimate, and the like.

Figure 2C:
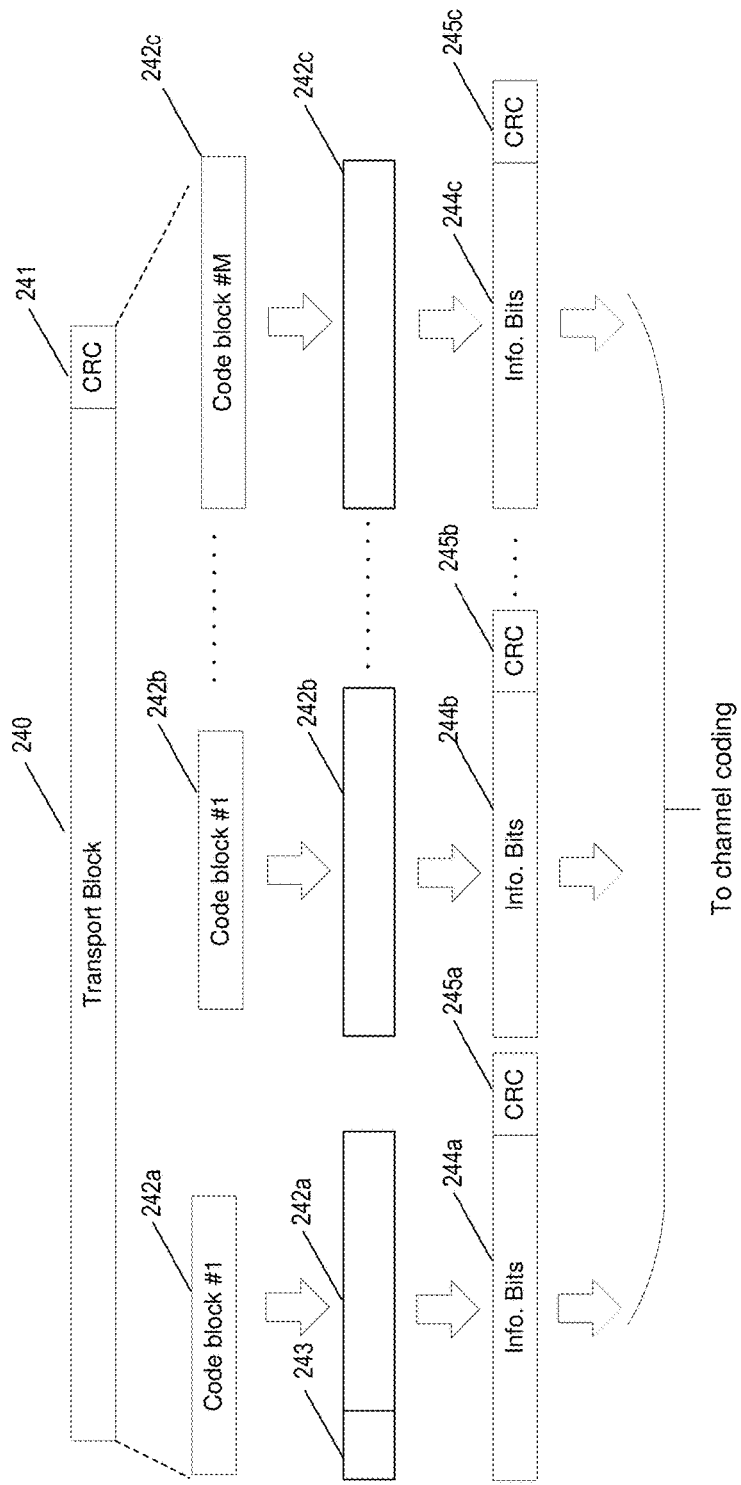
FIG. 2C is a block diagram illustrating an example, non-limiting embodiment of code blocks processed by the communication systems of FIGS. 2A, 2B and 2C and functioning within the communication network of FIG. 1 in accordance with various aspects described herein.

FIG. 2C is a block diagram illustrating an example, non-limiting embodiment of information blocks processed by the communication systems of FIGS. 2A, 2B and 2C and functioning within the communication network of FIG. 1 in accordance with various aspects described herein. In at least some applications, such as 3GPP standards generally known as 5G standards, e.g., related to so-called new radio (NR) access, information is processed in the form of data blocks. According to the illustrative example the information is in the form of a transport data block 240. The transport data block 240 is encoded prior to transmission using a channel code, such as a forward error correction code. In particular, the example transport block 240 is encoded using a systematic code, such as an LDPC code.

In a first step of a physical-layer processing, a first error check value 241, e.g., a 24-bit CRC, is calculated for each transport block 240 and combined with, e.g., appended to, the corresponding transport block 240. The error check value 241, e.g., the CRC value, allows for receiver-side detection of errors in a decoded transport block obtained by decoding the received transport block 240 after transmission or transport via a communication channel. The corresponding error indication can, for example, be used by a downlink hybrid-ARQ protocol as a trigger for requesting retransmissions. If the transport block 240, including the transport-block CRC 241, exceeds a maximum code-block size (e.g., 8448 bits for base graph 2 and 3840 bits for Base graph 2), a code-block segmentation can be applied at the transmitter side, before the LDPC coding, as shown in FIG. 2C.

According to the illustrative example, the first CRC appended transport data block is larger than a maximum block size. Accordingly, a code-block segmentation is applied to subdivide or otherwise segment the transport block and its appended CRC value 241 into a group of smaller, segmented code blocks, a sizes of which can be determined to match a set of one or more code-block sizes supported by the coder, e.g., by an LDPC coder. In the illustrative example, the segmenting results in three code-block segments 242a, 242b, 242c, generally 242.

In a case of a single code block or transport block 240 when no segmentation is needed, no additional code-block CRC value 245 is applied, code-block segmentation is only applied to large transport blocks 240 for which the relative extra overhead due to the additional transport block CRC value 245 is small. Information about the transport-block size can be provided to a terminal as part of a scheduling assignment transmitted on the physical downlink control channel (PDCCH). Based on this information, the terminal can determine the code-block size and number of code blocks. The terminal receiver can thus, based on the information provided in the scheduling assignment, straightforwardly undo or assemble the code-block segmentation and recover the decoded transport blocks.

In at least some embodiments, one or more bits 243 can be added to one or more of the transport block segments 242 to obtain modified transport block segments 244a, 244b, 244c, generally 244. For example, the added bits 243 can be padding bits to accommodate a common sized code block segment 242. The modified transport block segments 244 include groups of information bits. In at least some embodiments, a physical-layer processing includes another error check value 245a, 245b, 245c, generally 245, e.g., a 24-bit CRC, is calculated for each transport block segment 242, or for each modified transport block segment 244, as the case may be, and appended to a corresponding transport block segment 244. Channel coding can be applied to each of the transport block segments 244, including the additional CRC values 245.

Note that once the information bits are segmented and encoded using LDPC code (either base graph 1 or 2), they need to be rate matched for the transmission. New Radio (NR) uses a circular buffer for rate matching each code block. As an example, the standard defines four redundancy versions: RV0, RV1, RV2 and RV3. The starting positions of each redundancy version is shown in Table 1.

TABLE 1

Starting position of different redundancy versions, $k_0$

| | $k_0$ | |
|---|---|---|
| $rv_{id}$ | Base graph 1 | Base graph 2 |
| 0 | 0 | 0 |
| 1 | $\left\lfloor \frac{17N_{cb}}{66Z_c} \right\rfloor Z_c$ | $\left\lfloor \frac{13N_{cb}}{50Z_c} \right\rfloor Z_c$ |
| 2 | $\left\lfloor \frac{33N_{cb}}{66Z_c} \right\rfloor Z_c$ | $\left\lfloor \frac{25N_{cb}}{50Z_c} \right\rfloor Z_c$ |
| 3 | $\left\lfloor \frac{56N_{cb}}{66Z_c} \right\rfloor Z_c$ | $\left\lfloor \frac{43N_{cb}}{50Z_c} \right\rfloor Z_c$ |

In NR, for each transmission, the network needs to inform to the UE which redundancy version it is currently scheduling. This is communicated via the downlink control channel for PDSCH transmission and downlink control channel (grant channel) for uplink data transmission.

In general a receiver decodes the coded bits to determine the information bits. That is after passing through the LDPC decoder, it checks whether the CRC of the transport block is pass or not to determine the HARQ-ACK. In general, decoding of LDPC codes involves message passing between the check nodes and data nodes. The soft bit information is updated in each iteration and involves many computations. In general the number of iterations are set to fixed value say 25 or 50. This involves storing of the coded bits and involves many arithmetic operations. Hence the receiver has to allocate resources for decoding LDPC codes for every slot.

Figure 2D:
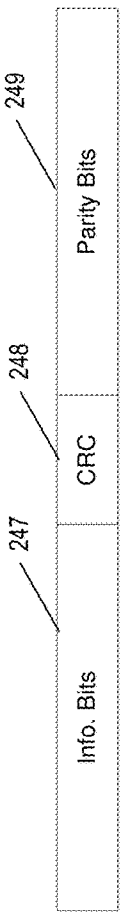
FIG. 2D is a block diagram illustrating an example, non-limiting embodiment of a forward error corrected code block obtained from a code block of FIG. 2D in accordance with various aspects described herein.

FIG. 2D is a block diagram illustrating an example, non-limiting embodiment of a forward error corrected code block 246 obtained from a CRC 245 appended, modified code block 244 code block of FIG. 2C in accordance with various aspects described herein. In general, the forward error corrected code block 246 includes a group of information bit 247, a CRC value 248 and a group of parity bits 249. The parity bits 249 correspond to redundant information added at the transmitter. According to systematic forward error correction codes, the information bit portion 247 of the forward error corrected code block 246 includes the original information bits of the code block segment 244*a*. Likewise, the CRC value 248 of the forward error corrected code block 246 includes the CRC value 245.

Figure 2E:
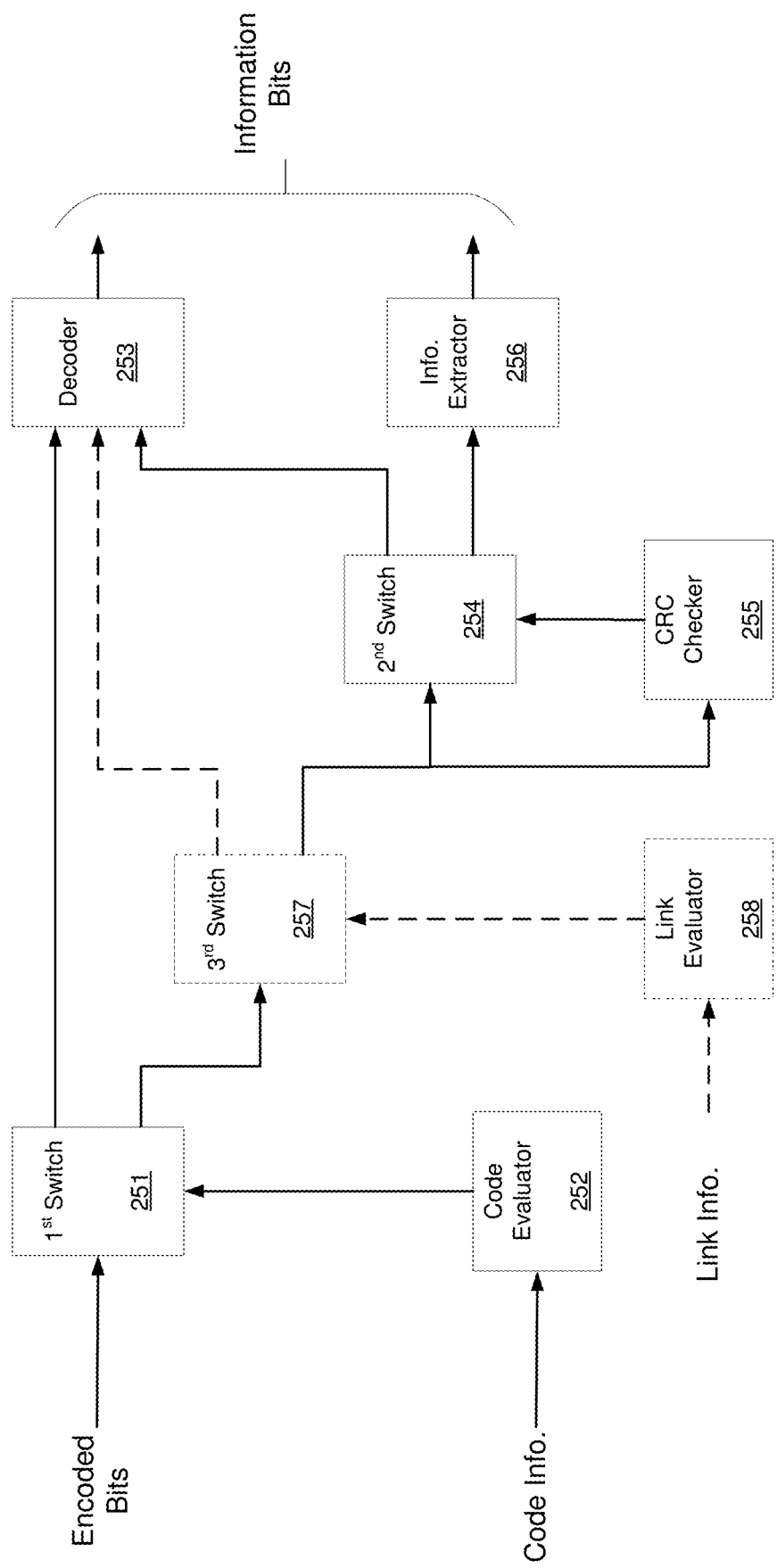
FIG. 2E is a block diagram illustrating an example of another, non-limiting embodiment of a receiver system adapted for communicating with the communication systems of FIGS. 2A and 2B and functioning within the communication network of FIG. 1 in accordance with various aspects described herein.

FIG. 2E is a block diagram illustrating an example of another, non-limiting embodiment of a receiver system 250 adapted for communicating with the communication systems of FIGS. 2A and 2B and functioning within the communication network of FIG. 1 in accordance with various aspects described herein. The example receiver system 250 can be implemented within a receiver, e.g., at a functional position at or just prior to a decoder. Alternatively or in addition, the receiver system 250 can be integrated into a decoder portion of a receiver.

The receiver system 250 receives encoded bits and processes the encoded bits to obtain information bits. The example receiver 250 includes a first switch 251, a code evaluator 252, a second switch 254 a CRC checker 255, an information extractor 256 and a decoder 253. The received encoded bits, e.g., a transport block, is applied to one terminal or port of the first switch 251. The first switch 251 is adapted to selectively direct the received encoded bits to the decoder 253, or to a second switch 254. Operation of the first switch 251 can be controlled by the code evaluator 252. According to the illustrative example, the code evaluator 252 receives code information indicative of a type of channel code applied at a transmitter prior to transmission of the transport block. For example, if the code information identifies the code as a systematic code, such as LDPC, then the first switch 251 directs the received encoded bits to the second switch 254 for further processing. However, if the code information identifies the code as a non-systematic code, then the first switch 251 directs the received encoded bits to the decoder 253, allowing the decoder 253 to decode and otherwise obtain the information bits according to the particular type of applied code.

In some embodiments, code information, such as the type of channel code, or type of error correction is provided to a receiver via a control channel. For example, the type of code is provided in a physical downlink control channel (PDCCH) associated with a physical downlink shared channel (PDSCH) and/or a physical uplink control channel (PUCCH) associated with a physical uplink shared channel (PUSCH). Alternatively or in addition, the code information can be fixed according to a schedule and/or preprogrammed.

For applications in which the type of code is fixed, the first switch 251 can be fixed to a corresponding orientation, e.g., directing all transport packets to one of the decoder 253 or the second switch 254, depending upon the fixed type of code. If there is no expectation for the code to change, namely, all transport blocks will always be received as either systematically encoded or non-systematically encoded blocks, it is conceivable that the first switch 251 could be removed altogether, and the routing of the received encoded bits essentially hard wired to an appropriate one of the decoder 253 or the second switch 254.

The second switch 254 receives encoded bits when the code evaluator 252 determines that the applied channel code and/or error correction code is a systematic code, such as LDPC. The CRC checker 255 also receives information from the received encoded bits, including the information bits and an error checking value, such as the example CRC value. The CRC checker 255 is adapted to process the information bits, e.g., according to an error checking algorithm, such as the example CRC algorithm to determine a locally determined error checking value. The CRC checker 255 can compare the locally determined error checking value to the error checking value determined at the transmitter and extracted from the received encoded bits. To the extent there is a match between these values, the CRC checker 255 provides a first output to the second switch 254. For example, the first output can indicate that the transport block was received successfully, and that the decoding step can be avoided. Accordingly, the second switch 254 can be adapted to direct the received encoded bits to an information extractor 256, whereby the information bits are extracted from the received encoded transport block without applying any decoding.

However, to the extent there is a mismatch between the locally determined error checking value to the error checking value determined at the transmitter and extracted from the received encoded bits, the CRC checker 255 provides a second output to the second switch 254. For example, the second output can indicate that the transport block was not received successfully, i.e., including at least one error. Having determined that at least one error exists in the received encoded bits, forward error correction can be applied in an attempt to correct the error(s). Accordingly, the second switch 254 can be adapted to direct the received encoded bits to the decoder 253, allowing the decoder 253 to decode and otherwise obtain the information bits according to the particular type of applied code.

Although the information extractor is illustrated as a separate component following the second switch 254, it is understood that in at least some embodiments, the information extractor can be provided before the CRC checker 255, as access to the information bits allows the CRC checker 255 to perform an error checking algorithm. In at least some embodiments, the transport blocks can be processed according to registers. For example, the encoded bits are temporarily stored in a register, allowing access to particular bits or groups of bits according to their bit-wise position within the register. For channel codes in which positions of one or more of the information bits 247 and the error checking bits 248 (FIG. 2D) are known, the respective bits can be directly extracted or routed for processing according to their positions.

In at least some embodiments, the receiver system 250 includes a third switch 257 and a link evaluator 258 (each shown in phantom). According to the illustrative example, the third switch 257 is positioned between the first switch 251 and the second switch 254. The third switch 257 receives encoded bits from the first switch 251 when the code evaluator 252 determines that the applied channel code and/or error correction code is a systematic code, such as LDPC. The link evaluator 258 also receives information indicative of one or more link conditions. The link conditions can include, without limitation, SNR, SINR, transmit signal strength, received signal strength, path loss, receiver location, transmitter location, transmitter-receiver separation distance, signal fading characteristics, multipath conditions, equipment operating conditions, e.g., configurations of mobile receiver, receiver gain, historical link information, e.g., according to a type of transmitter, a type of receiver, a location and/or link configuration and so on. The link evaluator 258 is adapted to process the link information to determine a measurement and/or an estimate of link conditions. Link conditions can be distinguished as being favorable or unfavorable, e.g., wherein favorability is an indication of error performance.

By way of example, the link evaluator 258 can receive and/or determine a received SNR or SINR associated with the received encoded bits. In at least some examples, the SNR or SINR corresponds to a so called long-term value. The concept of "long-term" can depend upon one or more of a particular application, a link condition, a type of encoding, a frequency of operation, a modulation type, whether one or more of the transmitter or receiver are moving or stationary, and so on. For example, a long-term SINR for a stationary configuration may correspond to seconds, tens of seconds, minutes, hours, days. Likewise, a long-term SINR for a mobile configuration may correspond to seconds or tens of seconds, as the link parameters are subject to change corresponding to a change of position, relative speed, etc. To the extent the link evaluator 258 determines that the link conditions are favorable for low-error performance, the link evaluator provides a control signal to the third switch 257 to direct the received encoded switch to the second switch 254 for further processing as disclosed above. However, to the extent the link evaluator 258 determines that the link conditions are unfavorable, indicating a likelihood for a relatively high-error performance, the link evaluator 258 provides a control signal to the third switch 257 to direct the received encoded switch to the decoder 253 for further processing as disclosed above.

It is understood that in at least some embodiments, the link evaluator compares one or determined more link conditions, such as SNR or SINR to a threshold value. To the extent that a comparison of the determined link conditions to the threshold is favorable, the link evaluator 258 controls the third switch 257 to direct the encoded bits to the second switch 254. However, to the extent that the comparison of the determined link conditions to the threshold value is unfavorable, the link evaluator 258 controls the third switch 257 to direct the encoded bits to the decoder 253. For long-term SNR or SINR threshold values, a determined link SNR or SINR above the threshold value is favorable, whereas, a determined link SNR or SINR below the threshold value is unfavorable.

Figure 2F:
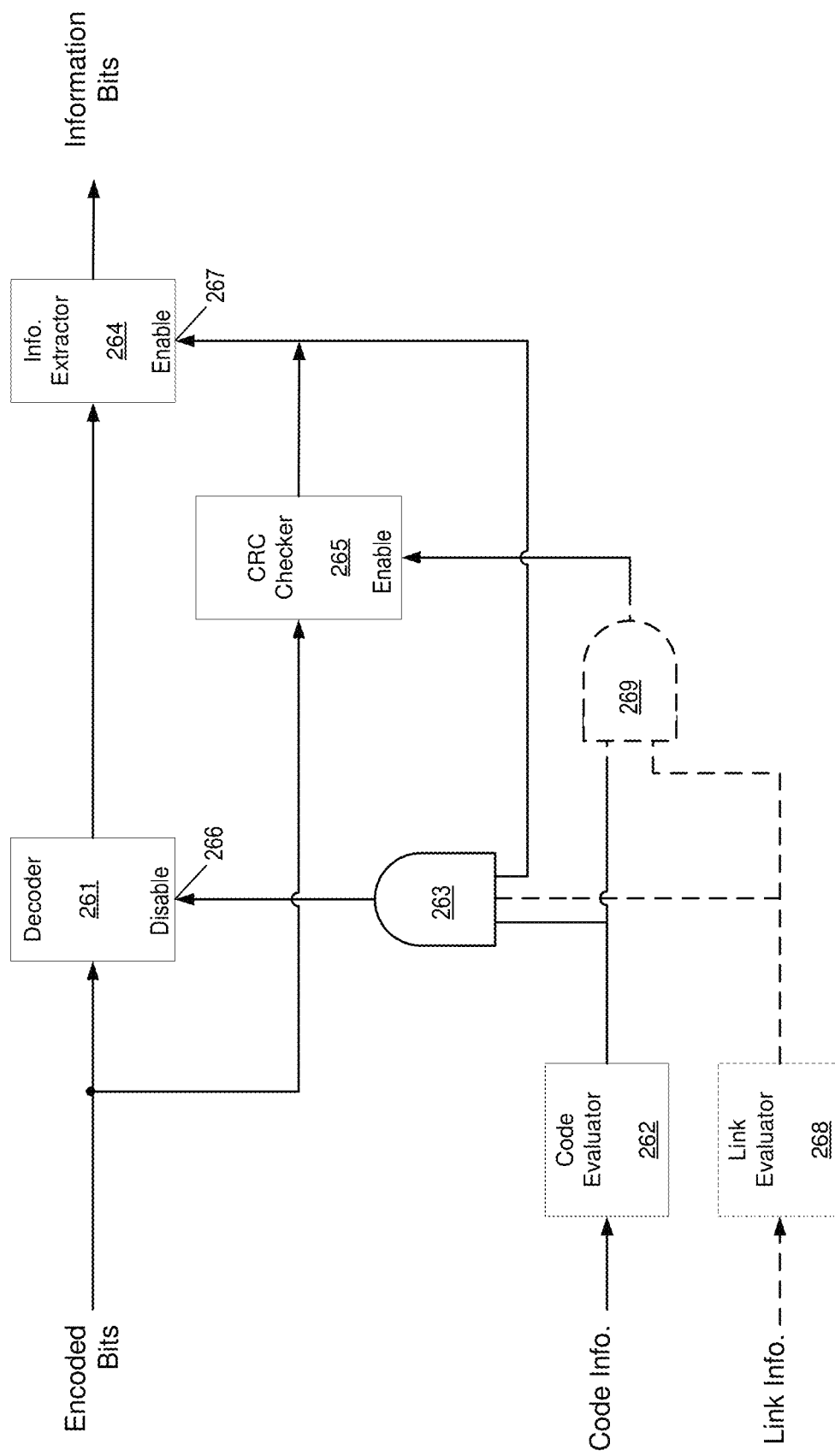
FIG. 2F depicts an illustrative embodiment of a process in accordance with various aspects described herein.

FIG. 2F depicts a block diagram illustrating an example of another, non-limiting embodiment of a receiver system 260 adapted for communicating with the communication systems of FIGS. 2A and 2B and functioning within the communication network of FIG. 1 in accordance with various aspects described herein. The example receiver system 260 can be implemented within a receiver, e.g., at a functional position at or just prior to a decoder. Alternatively or in addition, the receiver system 260 can be integrated into a decoder portion of a receiver.

The receiver system 260 receives encoded bits and processes the encoded bits to obtain information bits. The example receiver 260 includes a decoder 261, a code evaluator 262 a logical AND gate 263 an information extractor 264 and an error checker, such as a CRC checker 265. According to the illustrative example, the code evaluator 262 receives code information indicative of a type of channel code applied at a transmitter prior to transmission of the transport block. For example, if the code information identifies the code as a systematic code, such as LDPC, then the code evaluator 252 provides a logical "1" to an input of the logical AND gate 263. However, if the code information identifies the code as a non-systematic code, then the code evaluator 252 provides a logical "0" to an input of the logical AND gate 263.

An output of the logical AND gate can be applied to an enable/disable input 266 of the decoder 261. To the extent the decoder 261 is enabled, the encoded bits are decoded according to an applied channel or forward error correction code. To the extent that the decoder 261 is disabled, however, the received encoded bits are passed to the information extractor 264, without being decoded according to the channel/FEC encoding.

The example information extractor 264 includes and enable/disable control input 267. To the extent the information extractor 264 is enabled, the information bits of the encoded transport block are extracted without being decoded according to the channel/FEC encoding. For example, the enable input 267 of the decoder information extractor 264 can be tied to the disable input 266 of the decoder 261, such that the information extractor 264 is enabled whenever the decoder 261 is disabled, and such that the information extractor 264 is disabled whenever the decoder 261 is enabled.

The CRC checker 265 also receives information from the received encoded bits, including the information bits and an error checking value, such as the example CRC value. The CRC checker 265 is adapted to process the information bits, e.g., according to an error checking algorithm, such as the example CRC algorithm to determine a locally determined error checking value. The CRC checker 265 can compare the locally determined error checking value to the error checking value determined at the transmitter and extracted from the received encoded bits. To the extent there is a match between these values, the CRC checker 265 provides a first output to the logical AND gate 263. In at least some embodiments, the CRC checker 265 provides the first output to the enable input 267 of the information extractor 264. For example, the first output can indicate that the transport block was received successfully, and that the decoding step can be avoided. Accordingly, To the extent the code evaluator 262 also provided an input to the logical AND gate 263 that the code is a systematic code, both inputs are logical TRUE values, which places a true value on an output of the logical AND gate 263. The output of the logical AND gate 263 is applied to the disable input 266 of the decoder 261, disabling the decoder 261 when the combined conditions of a systematic code and a passing CRC check. The output of the CRC checker 265, indicating a passing CRC check also enables the information extractor 264, allowing the information bits to be extracted or otherwise obtained from the encoded transport block without having applied any channel/FEC decoding.

Alternatively, a failing CRC check provides a false value at the input of the logical AND gate 263, providing a logical FALSE output, which is applied to the disable input 266 of the decoder. In this instance, the decoder 261 is enabled (not disabled), and the transport block is decoded according to the appropriate channel/FEC encoding. The failing CRC check also provides a false value at the enable input 267 of the information extractor 264, disabling the information extractor and allowing the decoded information bits to be provided as an output of the receiver.

In some embodiments, the receiver 260 includes a link evaluator 268 and a second logical AND gate 269 (each shown in phantom). According to the illustrative example, the link evaluator 268 provides an output directed to an input of each of the logical AND gates 263, 269. The link evaluator 268 can operate similar to the link evaluator 258 (FIG. 2E) of the previous example. Namely, the link evaluator 268 receives information indicative of one or more link conditions. For example, the link evaluator 268 can receive and/or determine a received SNR or SINR associated with the received encoded bits. To the extent the link evaluator 268 determines that the link conditions are favorable for low-error performance, the link evaluator provides a logical TRUE value input to each of the logical AND gates 263, 269. However, to the extent the link evaluator 258 determines that the link conditions are unfavorable, indicating a likelihood for a relatively high-error performance, the link evaluator 268 provides a logical FALSE input to each of the logical AND gates 263, 269.

If link conditions are unfavorable, the output of both logical AND gates 263, 269 is FALSE, thereby enabling the decoder 261 and disabling the information extractor 264. Accordingly, the received transport block is decoded according to the appropriate channel/FEC code. However, if link conditions are favorable, the output of both logical AND gates 263, 269 are determined by operation of the code evaluator 262 and the CRC checker 265 as disclosed above.

Figure 2G:
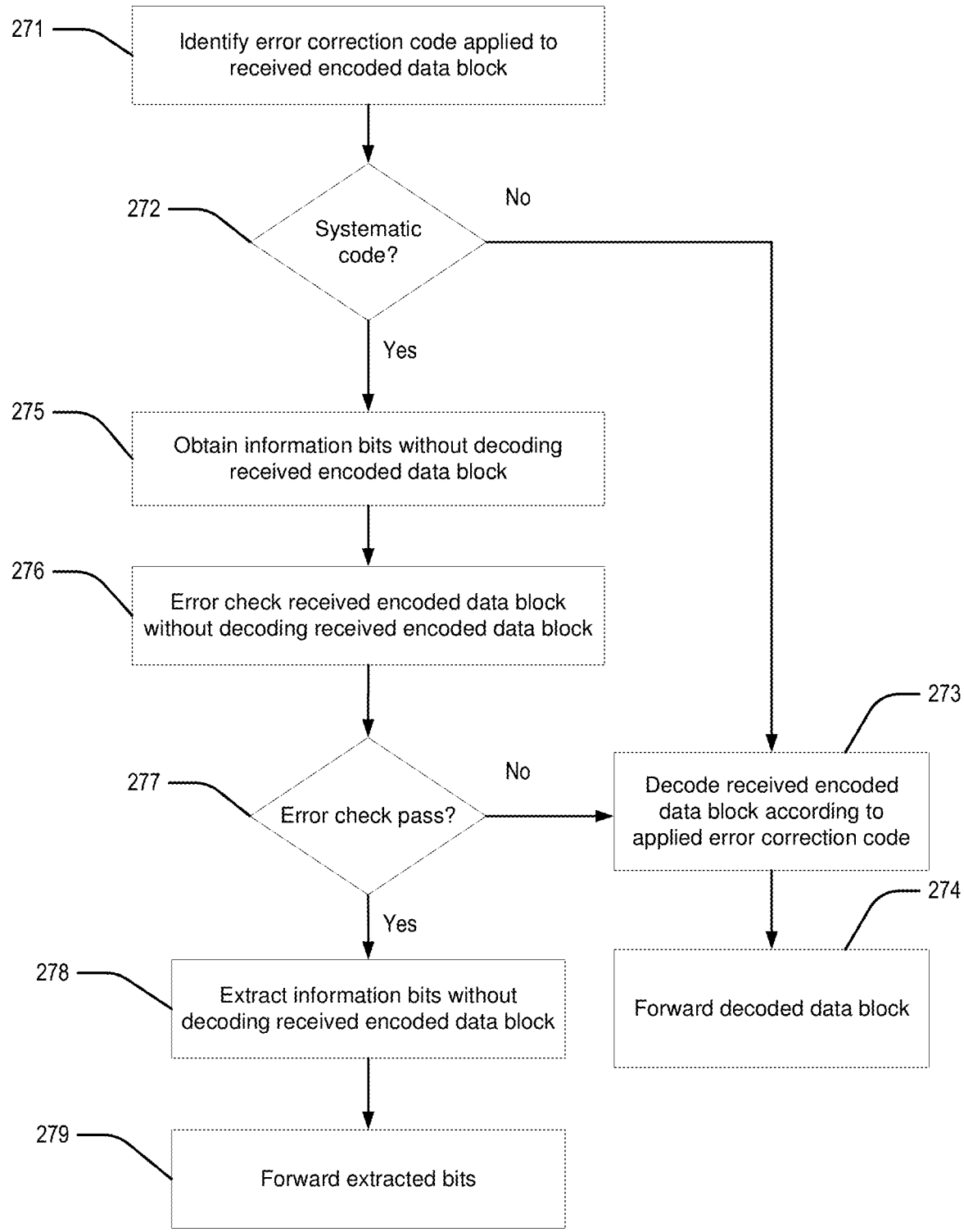
FIG. 2G depicts an illustrative embodiment of a process in accordance with various aspects described herein.

FIG. 2G depicts an illustrative embodiment of a transport block receiver process 270 in accordance with various aspects described herein. In an initial step, an error correction code applied to received encoded transport block is determined at 271. This can include determination of the precise channel/FEC code applied by the transmitter of the encoded transport block, or at least a category or type of code applied. Such a determination can be based on information obtained by way of a control channel associated with the communication channel over which the encoded transport block was conveyed. Alternatively or in addition, the determination can be based on other information obtained from a scheduler, a pre-configuration, a default value and the like.

Next, a determination is made as to whether the determined channel/FEC code or code type is a systematic code or a non-systematic code at 272. In at least some embodiments, a code's characteristic as systematic or non-systematic can be based on the identity of a code. For example, an LDPC code is generally known as a systematic code. To the extent it is determined at 272 that the channel/FEC code is not a systematic code, the received encode block is decoded at 273 and forwarded as a receiver output at 274. Decoding can include any suitable form of channel/FEC decoding determined at least in party by the type of channel/FEC code applied at the transmitter. According to the illustrative examples, the decoding can include LDPC decoding for LDPC codes applied at the transmitter.

To the extent it is determined at 272 that the channel/FEC code is a systematic code, information bits are obtained at 275 without decoding received encoded data block. The information bits 247 can be extracted based on their location in the encoded transport block 246 (FIG. 2D), without having to decode the encoded transport block 246. In at least some embodiments, the error check value or CRC bits 248 (FIG. 2D) are also extracted from the transport block without decoding. Likewise, the CRC bits 248 can be extracted according to their predetermined location within the encoded transport block 246.

Error checking of the received encoded data block is performed at 276, without decoding the received encoded data block. For example, an error checking algorithm, such as a CRC, is applied to the information bits extracted at 275 to obtain a received or locally determined error check value. The locally determined error check value can be compared at 277 to the CRC value extracted at 276 to determine whether the encoded transport block was received with any errors. To the extent it is determined at 277 that the encoded transport block was received with an error, the received encode block is decoded at 273 and forwarded as a receiver output at 274. However, to the extent it is determined at 277 that the encoded transport block was received without an error, information bits are obtained at 278 without decoding received encoded data block and forwarded as a receiver output at 279. It is understood that in at least some embodiments, further extraction of the information bits is unnecessary as they were extracted at 275 to accomplish the error checking. In such instances, the extracted information bits can merely be forwarded as the receiver output at 279.

Figure 2H:
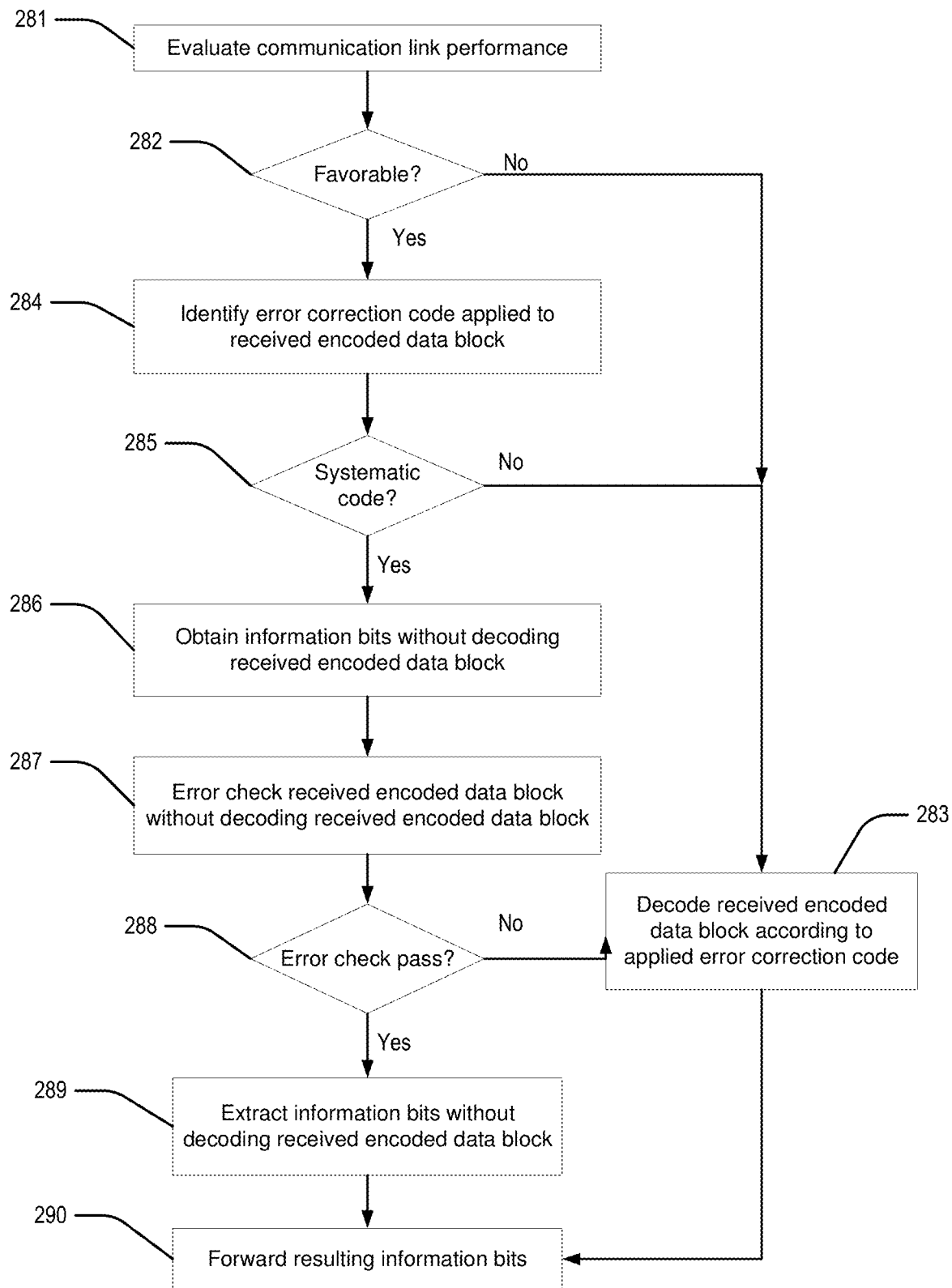
FIG. 2H depicts an illustrative embodiment of a process in accordance with various aspects described herein.

FIG. 2H depicts an illustrative embodiment of another transport block receiver process 280 in accordance with various aspects described herein. In an initial step, an evaluation of a link condition or performance criteria is determined at 281. The evaluation of the link condition can include any of the examples provided herein or otherwise known to those skilled in the art. For example, the evaluation can include a determination of a long-term SNR or SINR of the communication channel over which the encoded transport block was conveyed.

A determination is made at 282 as to whether the determined link condition was favorable or unfavorable. Favorability can be based on various evaluations, such as a comparison of the determined link condition to a threshold value. For example, favorability can be based on a determined that a long-term SNR or SINR is above a predetermined threshold value. Likewise, unfavorability can be based on a determination that the long-term SNR or SINR is below the predetermined threshold. To the extent that the determined link condition is unfavorable, the received encoded transport block is decoded at 283 and provided or otherwise forwarded as an output of the receiver at 290.

However, to the extent it is determined at 282 that the determined link condition is favorable, a further determination is made at 284 as to a type of error correction applied at the transmitter to the particular received encoded transport block.

A determination is made at 285 as to whether an applied channel/FEC code is a systematic code or a non-systematic code. To the extent it is determined at 285 that the channel/FEC code is not a systematic code, the received encode block is decoded at 283 and forwarded as a receiver output at 290.

To the extent it is determined at 285 that the channel/FEC code is a systematic code, information bits are extracted or otherwise obtained at 286 without decoding received encoded data block. Error checking is applied to the received encoded data block at 287 without decoding received encoded data block, e.g., according to calculation of a locally determined CRC value and comparison to a CRC value obtained from the received encoded transport block without decoding.

A determination is made at 288 as to whether the encoded transport block was received without an error. To the extent it is determined at 288 that the transport block was received with an error, the received encode block is decoded at 283 and forwarded as a receiver output at 290. To the extent it is determined at 288 that the transport block was received without an error, information bits are obtained at 289 without decoding received encoded data block and forwarded as a receiver output at 290. Once again, further extraction of the information bits at 289 may not be necessary as the information bits were extracted at 286 in order to determine the CRC value.

Figure 2I:
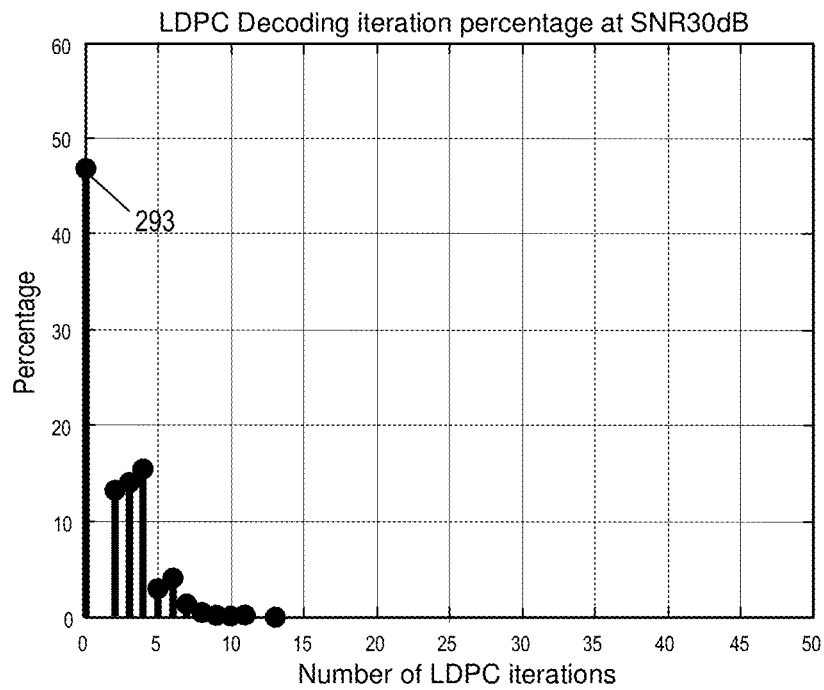
FIGS. 2I-2L depicts an illustrative embodiment of LDPC decoding iteration performance at various signal-to-noise-ratios in accordance with various aspects described herein.

While for purposes of simplicity of explanation, the respective processes are shown and described as a series of blocks in FIGS. 2G-2I, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein.

At least one motivation behind the techniques disclosed herein is that since the LDPC code standardized in NR is a systematic code, means that coded bits contains information bits, the receiver can decode the received information bits without invoking the LDPC decoder. This is especially true for communication links having a high SINR. For example as shown in FIGS. 2I-2L, numbers of iterations can be dependent on an SINR of a link between the transmitter and the receiver. At high SINR, say 30 dB (FIG. 1), the receiver can decode the data without invoking the LDPC decoder 55% of the time. That is receiver just checks the CRC bits by taking the information bits from the coded bits. Hence we propose that the receiver first obtains the information about the SNR of the link and decides whether to use systematic bits without invoking the decoder or not. If say the CRC bits are not passed, then it can invoke the LDPC decoder and can check whether the CRC bits are pass or not. Hence the complex computations of LDPC decoding can be avoided or at least minimized by applying the disclosed techniques.

Note that there are many methods to obtain the SNR of the link, for example by checking the output of a linear detector (e.g., the MMSE). Alternatively or in addition instantaneous SNR or SINR of the link can be determined. In at least some embodiments, the instantaneous values are averaged to determine long-term values. In other techniques, the receiver can check the long-term SNR or SINR of the link and decide whether to invoke the LDPC decoder first or not. Alternatively or in addition, the receiver checks the path loss of the link and if the path loss is less (high SNR), then checks the systematic bits without invoking the decoder. In at least some embodiments, a receiver modifies the LDPC decoding algorithm without checking the SNR/path loss as the receiver first check the systematic bits from the received coded bits. CRC check is applied on the hard coded systematic bits and if it is a pass then avoids invoking the LDPC decoder.

FIGS. 2I-2L depict iteration performance of an LDPC communication link under different SINR conditions. In particular, FIG. 2I depicts an illustrative an example LDPC decoding iteration performance graph 292 obtained at an SNR of 30 dB in accordance with various aspects described herein. The horizontal axis, labeled "Number of LDPC iterations" identifies numbers of iterations ranging from 0 to 50. The vertical axis, labeled "Percentage" identifies a percentage of a sample number of transport blocks, ranging from 0% to 60%. Data points are plotted on the graph, indicating a percentage of transport blocks for a particular number of LDPC iterations. According to the example graph, numbers of iterations for transport packets transported at 30 dB SNR, ranged from 0-13. A first point 293, identifies that approximately 48% of the transport blocks were transported successfully with no iterations at 30 dB SNR. Approximately 14% of the transport blocks required two iterations, approximately 15% required three iterations, and so on.

It is important to observe that a relatively high number of the transport blocks, i.e., nearly 50%, were transported successfully without any iterations. According to the techniques disclosed herein, if a systematic code, such as LDPC, had been applied to the transport blocks, then it is conceivable that data could be retrieved directly from the transport block, without requiring a channel decoding. A CRC value provided in the transport block could be obtained directly from the channel encoded transport block, without applying channel decoding and used to distinguish successfully transported packets from unsuccessfully transported packets. According to the illustrative example, at 30 dB SNR, the CRC values could be used to identify nearly 50% of the transport blocks as candidates for being processed to retrieve encoded data without applying channel decoding. Namely, at 30 dB SNR, check the CRC value. If the CRC value indicates a pass, simply extract the encoded data from the transport block without applying channel decoding. In at least some embodiments, the channel decoder can be disabled and/or turned off during reception of packets having a CRC passing result. For the remaining blocks, the CRC might indicate a failure, in which case, the channel encoded block can be decoded according to the appropriate channel code, e.g., LDPC.

Figure 2J:
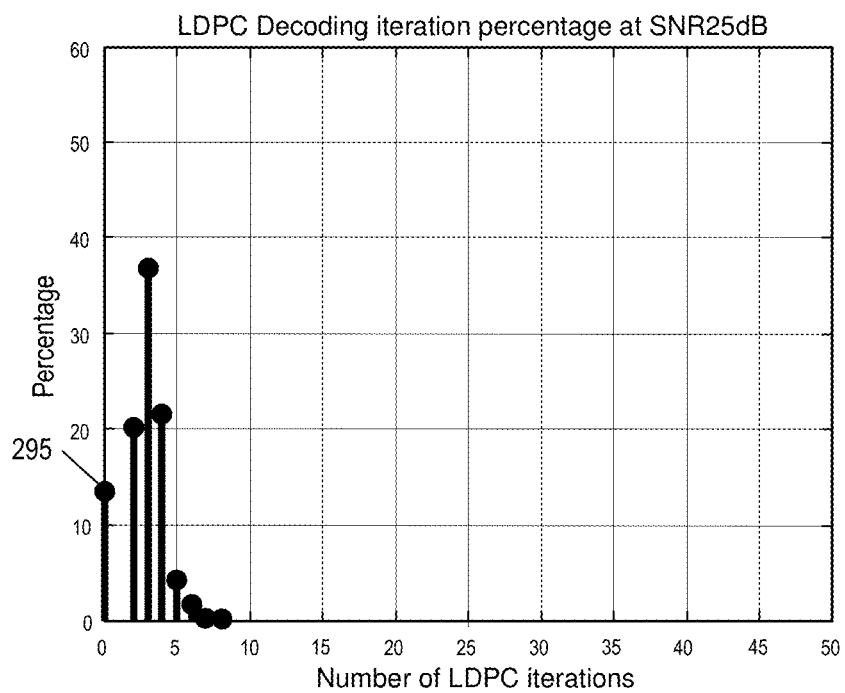

FIG. 2J depicts an illustrative an example LDPC decoding iteration performance graph 294 obtained at an SNR of 25 dB in accordance with various aspects described herein. According to the example graph, numbers of iterations for transport packets transported at 25 dB SNR, ranged from 0-8. A first point 295, identifies that approximately 14% of the transport blocks were transported successfully with no iterations at 25 dB SNR. Approximately 20% of the transport blocks required two iterations, approximately 38% required three iterations, and so on. As in the foregoing example, presuming a systematic channel encoding is applied, an evaluation of CRC values extracted from channel-encoded transport blocks can be used to distinguish a first group of transport blocks requiring no iterations from a second group of transport blocks requiring iterations. The first group of transport blocks can be processed by extracting the data from the transport block without applying channel decoding. The second group of transport blocks can be processed by applying channel decoding, error correction and so on.

Figure 2K:
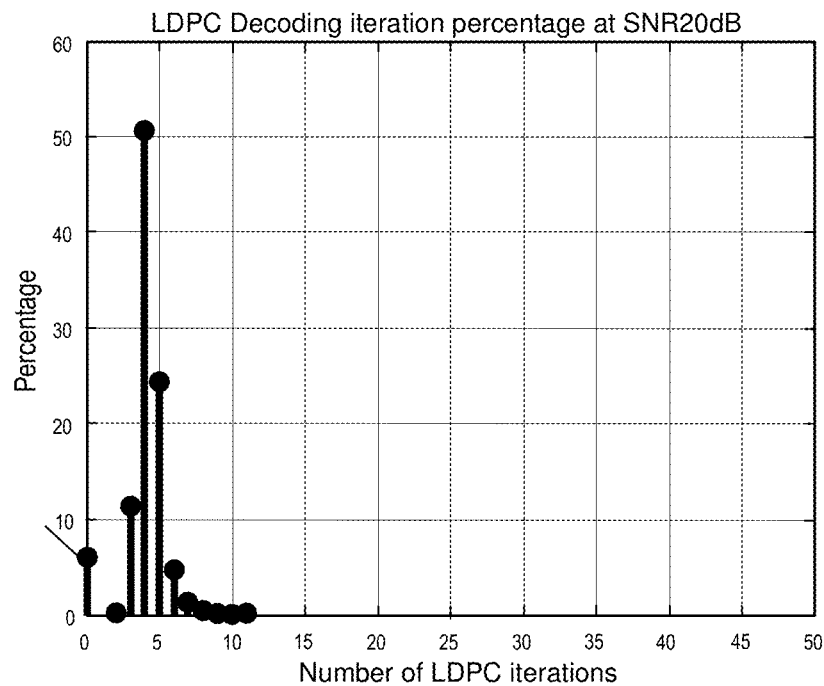

FIG. 2K depicts an illustrative an example LDPC decoding iteration performance graph 296 obtained at an SNR of 20 dB in accordance with various aspects described herein. According to the example graph, numbers of iterations for transport packets transported at 20 dB SNR, ranged from 0-12. A first point 297, identifies that approximately 8% of the transport blocks were transported successfully with no iterations at 20 dB SNR. Approximately 12% of the transport blocks required three iterations, approximately 51% required four iterations, and so on. As in the foregoing examples, presuming a systematic channel encoding is applied, a CRC value can be extracted from channel-encoded transport block without applying channel decoding. Once again, the CRC value can be used to distinguish a first group of transport blocks requiring no iterations from a second group of transport blocks requiring iterations. The first group of transport blocks can be processed by extracting the data from the transport block without applying channel decoding. The second group of transport blocks can be processed by applying channel decoding, error correction and so on. At 20 dB SNR, selective application of the channel decoding can still provide a benefit of avoiding the cost and complexity of channel decoding for about 8% of the transport packets.

Given the complexity of certain channel decoding techniques, such as LDPC, it is understood that benefits, e.g., processing, power, memory and/or any combination thereof can be realized by selectively decoding packets. It is understood that according to a cost-benefit analysis, there may be a non-zero percentage of zero iterations at which the cost of testing the CRC values and selectively applying the channel decoding outweighs the benefit of avoiding channel decoding processing. It is conceivable that such a percentage value may be 0%, 1%, a few percent, or more.

Figure 2L:
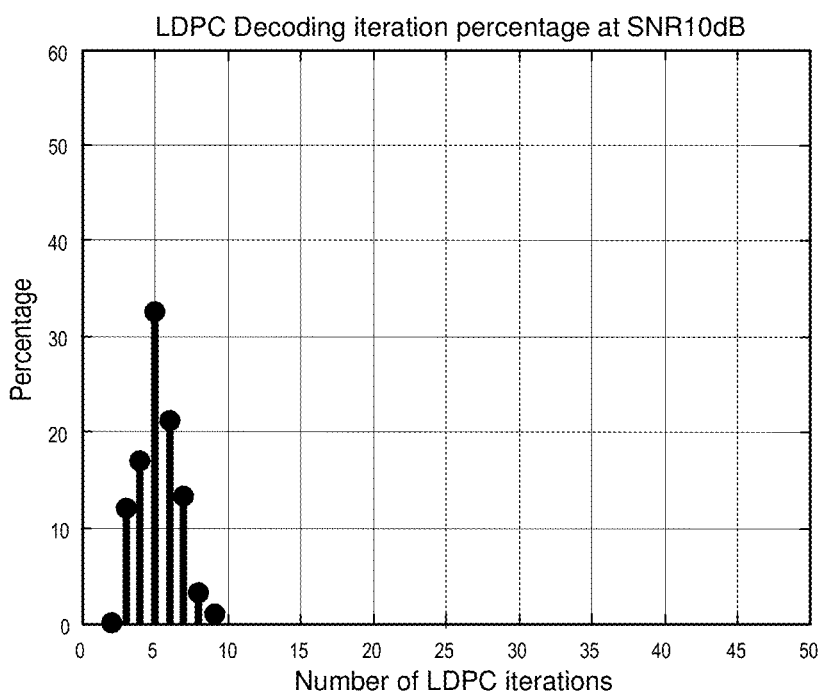

FIG. 2L depicts an illustrative an example LDPC decoding iteration performance graph 298 obtained at an SNR of 10 dB in accordance with various aspects described herein. According to the example graph, numbers of iterations for transport packets transported at 10 dB SNR, ranged from 2-9. None of the transport packets required zero iterations, i.e., every transport packet required a non-zero number of iterations. Since there are no transport blocks that could be successfully processed without requiring decoding, it is conceivable, that an application of the foregoing CRC checks of CRC values extracted without applying decoding may be unnecessary. According to some embodiments, a threshold value, such as a threshold SNR value can be predetermined, such that any test to determine whether data can be extracted without decoding the channel-encoded transport block is applied only when a threshold criteria is satisfied. According to the illustrative examples, the test value can be a link value, such as SNR or SINR. A threshold link value can be an SNR threshold, such as 20 dB (FIG. 2K), 10 dB (FIG. 2L), or perhaps an interpolated value, e.g., 15 dB determined as an average SNR between the SNR values of FIG. 2K having at least some zero-iteration results, and the SNR value of FIG. 2L having no non-zero iteration results.

Referring now to FIG. 3, a block diagram 300 is shown illustrating an example, non-limiting embodiment of a virtualized communication network in accordance with various aspects described herein. In particular a virtualized communication network is presented that can be used to implement some or all of the subsystems and functions of communication network 100, the subsystems and functions of systems 200, 219, and processes 270, 280 presented in FIGS. 1, 2A, 2B, 2G and 2H. For example, virtualized communication network 300 can facilitate in whole or in part a simplified processing of received channel-encoded data blocks under certain favorable conditions. For example, information bits can be extracted from a received channel-encoded data block without requiring any decoding, responsive to a favorable error check result, e.g., a favorable CRC, of the received channel-encoded data block. In at least some embodiments, a channel decoder is temporarily disabled responsive to a determination that systematic channel encoding was applied to the data block prior to transmission, and upon a favorable error check of the received channel-encoded data block.

In particular, a cloud networking architecture is shown that leverages cloud technologies and supports rapid innovation and scalability via a transport layer 350, a virtualized network function cloud 325 and/or one or more cloud computing environments 375. In various embodiments, this cloud networking architecture is an open architecture that leverages application programming interfaces (APIs); reduces complexity from services and operations; supports more nimble business models; and rapidly and seamlessly scales to meet evolving customer requirements including traffic growth, diversity of traffic types, and diversity of performance and reliability expectations.

In contrast to traditional network elements—which are typically integrated to perform a single function, the virtualized communication network employs virtual network elements (VNEs) 330, 332, 334, etc., that perform some or all of the functions of network elements 150, 152, 154, 156, etc. For example, the network architecture can provide a substrate of networking capability, often called Network Function Virtualization Infrastructure (NFVI) or simply infrastructure that is capable of being directed with software and Software Defined Networking (SDN) protocols to perform a broad variety of network functions and services. This infrastructure can include several types of substrates. The most typical type of substrate being servers that support Network Function Virtualization (NFV), followed by packet forwarding capabilities based on generic computing resources, with specialized network technologies brought to bear when general purpose processors or general purpose integrated circuit devices offered by merchants (referred to herein as merchant silicon) are not appropriate. In this case, communication services can be implemented as cloud-centric workloads.

As an example, a traditional network element 150 (shown in FIG. 1), such as an edge router can be implemented via a VNE 330 composed of NFV software modules, merchant silicon, and associated controllers. The software can be written so that increasing workload consumes incremental resources from a common resource pool, and moreover so that it's elastic: so the resources are only consumed when needed. In a similar fashion, other network elements such as other routers, switches, edge caches, and middle-boxes are instantiated from the common resource pool. Such sharing of infrastructure across a broad set of uses makes planning and growing infrastructure easier to manage.

In an embodiment, the transport layer 350 includes fiber, cable, wired and/or wireless transport elements, network elements and interfaces to provide broadband access 110, wireless access 120, voice access 130, media access 140 and/or access to content sources 175 for distribution of content to any or all of the access technologies. In particular, in some cases a network element needs to be positioned at a specific place, and this allows for less sharing of common infrastructure. Other times, the network elements have specific physical layer adapters that cannot be abstracted or virtualized, and might require special DSP code and analog front-ends (AFEs) that do not lend themselves to implementation as VNEs 330, 332 or 334. These network elements can be included in transport layer 350.

The virtualized network function cloud 325 interfaces with the transport layer 350 to provide the VNEs 330, 332, 334, etc., to provide specific NFVs. In particular, the virtualized network function cloud 325 leverages cloud operations, applications, and architectures to support networking workloads. The virtualized network elements 330, 332 and 334 can employ network function software that provides either a one-for-one mapping of traditional network element function or alternately some combination of network functions designed for cloud computing. For example, VNEs 330, 332 and 334 can include route reflectors, domain name system (DNS) servers, and dynamic host configuration protocol (DHCP) servers, system architecture evolution (SAE) and/or mobility management entity (MME) gateways, broadband network gateways, IP edge routers for IP-VPN, Ethernet and other services, load balancers, distributers and other network elements. Because these elements don't typically need to forward large amounts of traffic, their workload can be distributed across a number of servers—each of which adds a portion of the capability, and overall which creates an elastic function with higher availability than its former monolithic version. These virtual network elements 330, 332, 334, etc., can be instantiated and managed using an orchestration approach similar to those used in cloud compute services.

The cloud computing environments 375 can interface with the virtualized network function cloud 325 via APIs that expose functional capabilities of the VNEs 330, 332, 334, etc., to provide the flexible and expanded capabilities to the virtualized network function cloud 325. In particular, network workloads may have applications distributed across the virtualized network function cloud 325 and cloud computing environment 375 and in the commercial cloud, or might simply orchestrate workloads supported entirely in NFV infrastructure from these third party locations.

Figure 4:
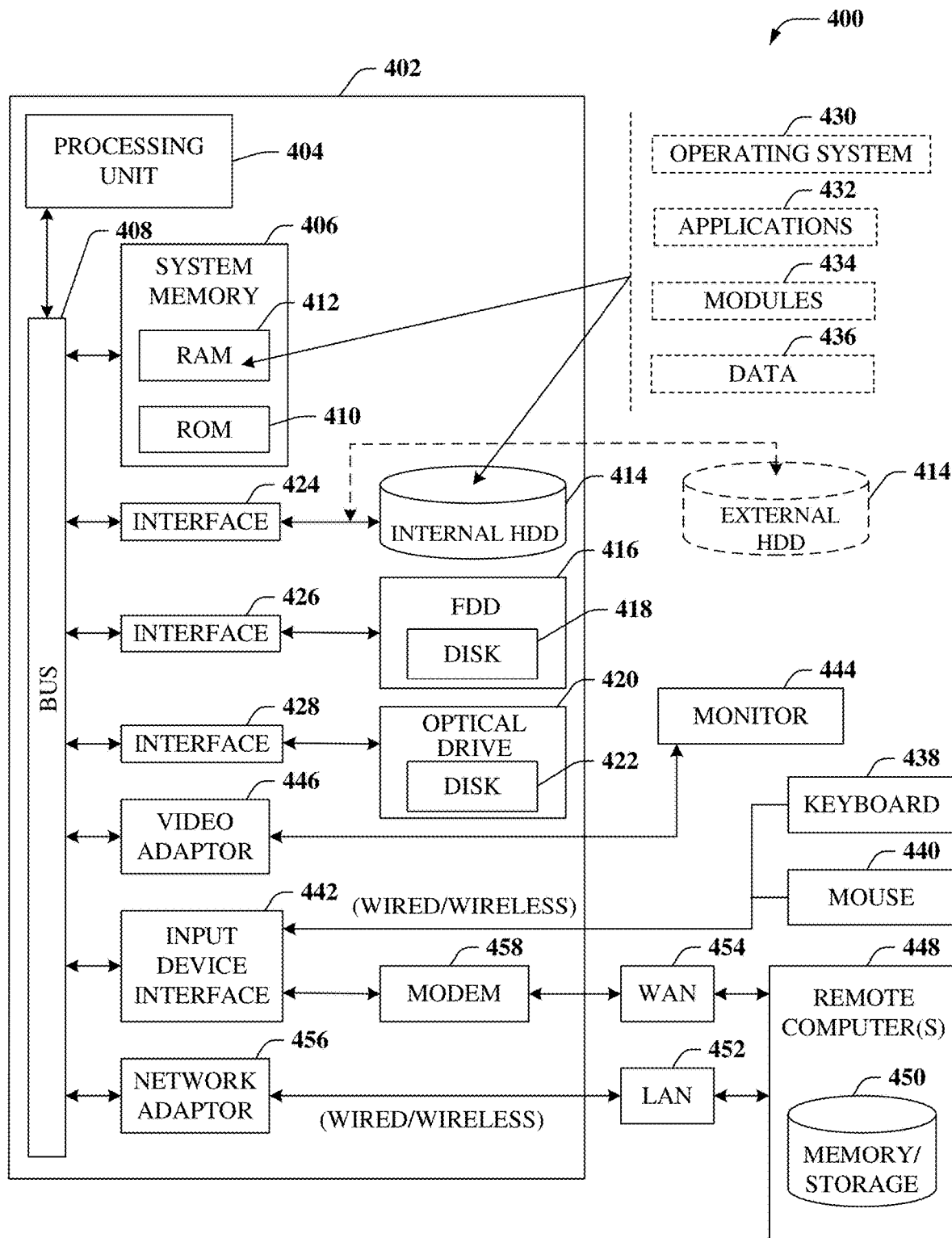
FIG. 4 is a block diagram of an example, non-limiting embodiment of a computing environment in accordance with various aspects described herein.

Turning now to FIG. 4, there is illustrated a block diagram of a computing environment in accordance with various aspects described herein. In order to provide additional context for various embodiments of the embodiments described herein, FIG. 4 and the following discussion are intended to provide a brief, general description of a suitable computing environment 400 in which the various embodiments of the subject disclosure can be implemented. In particular, computing environment 400 can be used in the implementation of network elements 150, 152, 154, 156, access terminal 112, base station or access point 122, switching device 132, media terminal 142, and/or VNEs 330, 332, 334, etc. Each of these devices can be implemented via computer-executable instructions that can run on one or more computers, and/or in combination with other program modules and/or as a combination of hardware and software. For example, computing environment 400 can facilitate in whole or in part a simplified processing of received channel-encoded data blocks under certain favorable conditions. For example, information bits can be extracted from a received channel-encoded data block without requiring any decoding, responsive to a favorable error check result, e.g., a favorable CRC, of the received channel-encoded data block. In at least some embodiments, a channel decoder is temporarily disabled responsive to a determination that systematic channel encoding was applied to the data block prior to transmission, and upon a favorable error check of the received channel-encoded data block.

Generally, program modules comprise routines, programs, components, data structures, etc., that perform particular tasks or implement particular abstract data types. Moreover, those skilled in the art will appreciate that the methods can be practiced with other computer system configurations, comprising single-processor or multiprocessor computer systems, minicomputers, mainframe computers, as well as personal computers, hand-held computing devices, microprocessor-based or programmable consumer electronics, and the like, each of which can be operatively coupled to one or more associated devices.

As used herein, a processing circuit includes one or more processors as well as other application specific circuits such as an application specific integrated circuit, digital logic circuit, state machine, programmable gate array or other circuit that processes input signals or data and that produces output signals or data in response thereto. It should be noted that while any functions and features described herein in association with the operation of a processor could likewise be performed by a processing circuit.

The illustrated embodiments of the embodiments herein can be also practiced in distributed computing environments where certain tasks are performed by remote processing devices that are linked through a communications network. In a distributed computing environment, program modules can be located in both local and remote memory storage devices.

Computing devices typically comprise a variety of media, which can comprise computer-readable storage media and/or communications media, which two terms are used herein differently from one another as follows. Computer-readable storage media can be any available storage media that can be accessed by the computer and comprises both volatile and nonvolatile media, removable and non-removable media. By way of example, and not limitation, computer-readable storage media can be implemented in connection with any method or technology for storage of information such as computer-readable instructions, program modules, structured data or unstructured data.

Computer-readable storage media can comprise, but are not limited to, random access memory (RAM), read only memory (ROM), electrically erasable programmable read only memory (EEPROM), flash memory or other memory technology, compact disk read only memory (CD-ROM), digital versatile disk (DVD) or other optical disk storage, magnetic cassettes, magnetic tape, magnetic disk storage or other magnetic storage devices or other tangible and/or non-transitory media which can be used to store desired information. In this regard, the terms "tangible" or "non-transitory" herein as applied to storage, memory or computer-readable media, are to be understood to exclude only propagating transitory signals per se as modifiers and do not relinquish rights to all standard storage, memory or computer-readable media that are not only propagating transitory signals per se.

Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and comprises any information delivery or transport media. The term "modulated data signal" or signals refers to a signal that has one or more of its characteristics set or changed in such a manner as to encode information in one or more signals. By way of example, and not limitation, communication media comprise wired media, such as a wired network or direct-wired connection, and wireless media such as acoustic, RF, infrared and other wireless media.

With reference again to FIG. 4, the example environment can comprise a computer 402, the computer 402 comprising a processing unit 404, a system memory 406 and a system bus 408. The system bus 408 couples system components including, but not limited to, the system memory 406 to the processing unit 404. The processing unit 404 can be any of various commercially available processors. Dual microprocessors and other multiprocessor architectures can also be employed as the processing unit 404.

The system bus 408 can be any of several types of bus structure that can further interconnect to a memory bus (with or without a memory controller), a peripheral bus, and a local bus using any of a variety of commercially available bus architectures. The system memory 406 comprises ROM 410 and RAM 412. A basic input/output system (BIOS) can be stored in a non-volatile memory such as ROM, erasable programmable read only memory (EPROM), EEPROM, which BIOS contains the basic routines that help to transfer information between elements within the computer 402, such as during startup. The RAM 412 can also comprise a high-speed RAM such as static RAM for caching data.

The computer 402 further comprises an internal hard disk drive (HDD) 414 (e.g., EIDE, SATA), which internal HDD 414 can also be configured for external use in a suitable chassis (not shown), a magnetic floppy disk drive (FDD) 416, (e.g., to read from or write to a removable diskette 418) and an optical disk drive 420, (e.g., reading a CD-ROM disk 422 or, to read from or write to other high capacity optical media such as the DVD). The HDD 414, magnetic FDD 416 and optical disk drive 420 can be connected to the system bus 408 by a hard disk drive interface 424, a magnetic disk drive interface 426 and an optical drive interface 428, respectively. The hard disk drive interface 424 for external drive implementations comprises at least one or both of Universal Serial Bus (USB) and Institute of Electrical and Electronics Engineers (IEEE) 1394 interface technologies. Other external drive connection technologies are within contemplation of the embodiments described herein.

The drives and their associated computer-readable storage media provide nonvolatile storage of data, data structures, computer-executable instructions, and so forth. For the computer 402, the drives and storage media accommodate the storage of any data in a suitable digital format. Although the description of computer-readable storage media above refers to a hard disk drive (HDD), a removable magnetic diskette, and a removable optical media such as a CD or DVD, it should be appreciated by those skilled in the art that other types of storage media which are readable by a computer, such as zip drives, magnetic cassettes, flash memory cards, cartridges, and the like, can also be used in the example operating environment, and further, that any such storage media can contain computer-executable instructions for performing the methods described herein.

A number of program modules can be stored in the drives and RAM 412, comprising an operating system 430, one or more application programs 432, other program modules 434 and program data 436. All or portions of the operating system, applications, modules, and/or data can also be cached in the RAM 412. The systems and methods described herein can be implemented utilizing various commercially available operating systems or combinations of operating systems.

A user can enter commands and information into the computer 402 through one or more wired/wireless input devices, e.g., a keyboard 438 and a pointing device, such as a mouse 440. Other input devices (not shown) can comprise a microphone, an infrared (IR) remote control, a joystick, a game pad, a stylus pen, touch screen or the like. These and other input devices are often connected to the processing unit 404 through an input device interface 442 that can be coupled to the system bus 408, but can be connected by other interfaces, such as a parallel port, an IEEE 1394 serial port, a game port, a universal serial bus (USB) port, an IR interface, etc.

A monitor 444 or other type of display device can be also connected to the system bus 408 via an interface, such as a video adapter 446. It will also be appreciated that in alternative embodiments, a monitor 444 can also be any display device (e.g., another computer having a display, a smart phone, a tablet computer, etc.) for receiving display information associated with computer 402 via any communication means, including via the Internet and cloud-based networks. In addition to the monitor 444, a computer typically comprises other peripheral output devices (not shown), such as speakers, printers, etc.

The computer 402 can operate in a networked environment using logical connections via wired and/or wireless communications to one or more remote computers, such as a remote computer(s) 448. The remote computer(s) 448 can be a workstation, a server computer, a router, a personal computer, portable computer, microprocessor-based entertainment appliance, a peer device or other common network node, and typically comprises many or all of the elements described relative to the computer 402, although, for purposes of brevity, only a remote memory/storage device 450 is illustrated. The logical connections depicted comprise wired/wireless connectivity to a local area network (LAN) 452 and/or larger networks, e.g., a wide area network (WAN) 454. Such LAN and WAN networking environments are commonplace in offices and companies, and facilitate enterprise-wide computer networks, such as intranets, all of which can connect to a global communications network, e.g., the Internet.

When used in a LAN networking environment, the computer 402 can be connected to the LAN 452 through a wired and/or wireless communication network interface or adapter 456. The adapter 456 can facilitate wired or wireless communication to the LAN 452, which can also comprise a wireless AP disposed thereon for communicating with the adapter 456.

When used in a WAN networking environment, the computer 402 can comprise a modem 458 or can be connected to a communications server on the WAN 454 or has other means for establishing communications over the WAN 454, such as by way of the Internet. The modem 458, which can be internal or external and a wired or wireless device, can be connected to the system bus 408 via the input device interface 442. In a networked environment, program modules depicted relative to the computer 402 or portions thereof, can be stored in the remote memory/storage device 450. It will be appreciated that the network connections shown are example and other means of establishing a communications link between the computers can be used.

The computer 402 can be operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, restroom), and telephone. This can comprise Wireless Fidelity (Wi-Fi) and BLUETOOTH® wireless technologies. Thus, the communication can be a predefined structure as with a conventional network or simply an ad hoc communication between at least two devices.

Wi-Fi can allow connection to the Internet from a couch at home, a bed in a hotel room or a conference room at work, without wires. Wi-Fi is a wireless technology similar to that used in a cell phone that enables such devices, e.g., computers, to send and receive data indoors and out; anywhere within the range of a base station. Wi-Fi networks use radio technologies called IEEE 802.11 (a, b, g, n, ac, ag, etc.) to provide secure, reliable, fast wireless connectivity. A Wi-Fi network can be used to connect computers to each other, to the Internet, and to wired networks (which can use IEEE 802.3 or Ethernet). Wi-Fi networks operate in the unlicensed 2.4 and 5 GHz radio bands for example or with products that contain both bands (dual band), so the networks can provide real-world performance similar to the basic 10BaseT wired Ethernet networks used in many offices.

Figure 5:
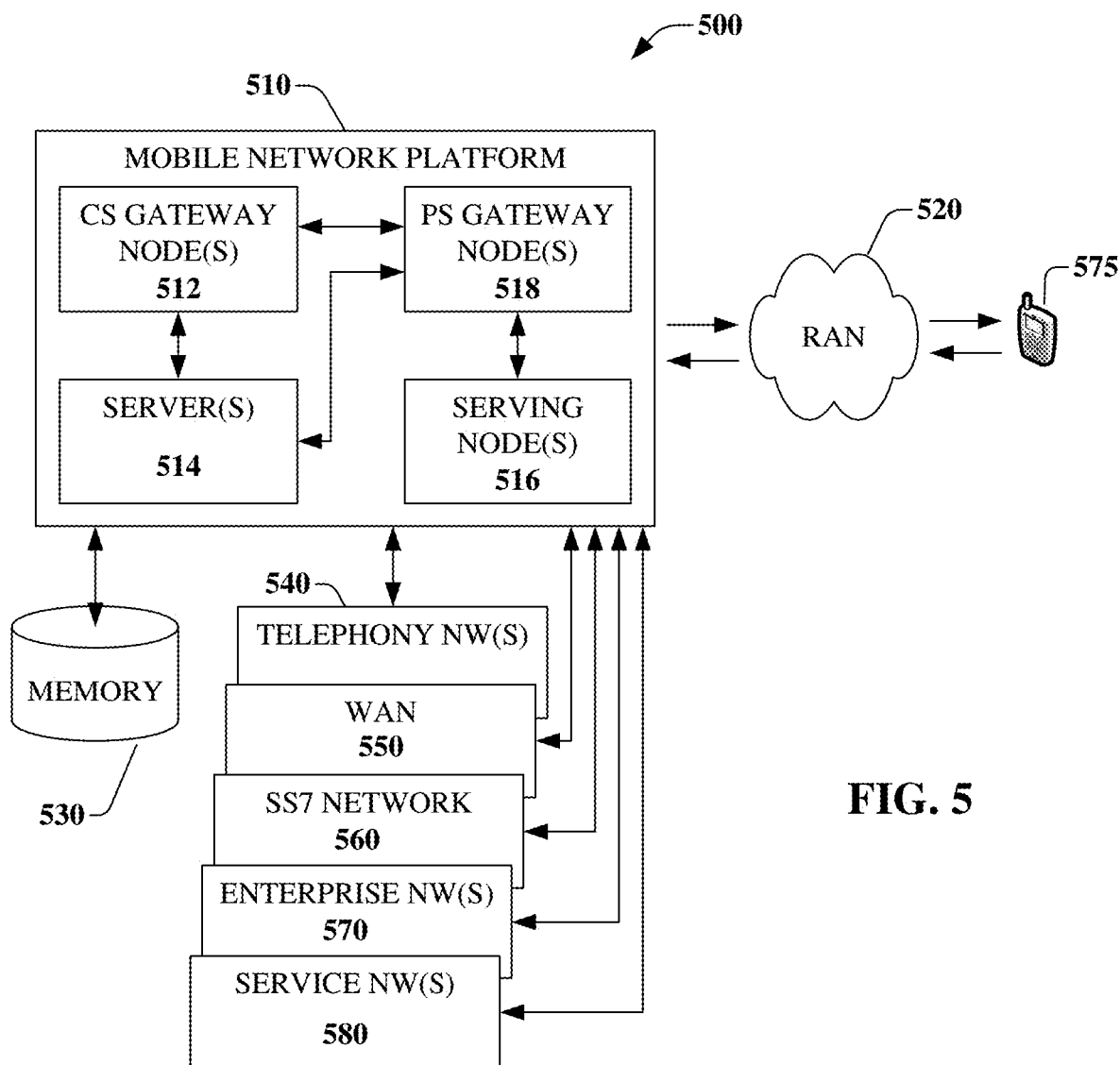
FIG. 5 is a block diagram of an example, non-limiting embodiment of a mobile network platform in accordance with various aspects described herein.

Turning now to FIG. 5, an embodiment 500 of a mobile network platform 510 is shown that is an example of network elements 150, 152, 154, 156, and/or VNEs 330, 332, 334, etc. For example, platform 510 can facilitate in whole or in part a simplified processing of received channel-encoded data blocks under certain favorable conditions. For example, information bits can be extracted from a received channel-encoded data block without requiring any decoding, responsive to a favorable error check result, e.g., a favorable CRC, of the received channel-encoded data block. In at least some embodiments, a channel decoder is temporarily disabled responsive to a determination that systematic channel encoding was applied to the data block prior to transmission, and upon a favorable error check of the received channel-encoded data block. In one or more embodiments, the mobile network platform 510 can generate and receive signals transmitted and received by base stations or access points such as base station or access point 122. Generally, mobile network platform 510 can comprise components, e.g., nodes, gateways, interfaces, servers, or disparate platforms, that facilitate both packet-switched (PS) (e.g., internet protocol (IP), frame relay, asynchronous transfer mode (ATM)) and circuit-switched (CS) traffic (e.g., voice and data), as well as control generation for networked wireless telecommunication. As a non-limiting example, mobile network platform 510 can be included in telecommunications carrier networks, and can be considered carrier-side components as discussed elsewhere herein. Mobile network platform 510 comprises CS gateway node(s) 512 which can interface CS traffic received from legacy networks like telephony network(s) 540 (e.g., public switched telephone network (PSTN), or public land mobile network (PLMN)) or a signaling system #7 (SS7) network 560. CS gateway node(s) 512 can authorize and authenticate traffic (e.g., voice) arising from such networks. Additionally, CS gateway node(s) 512 can access mobility, or roaming, data generated through SS7 network 560; for instance, mobility data stored in a visited location register (VLR), which can reside in memory 530. Moreover, CS gateway node(s) 512 interfaces CS-based traffic and signaling and PS gateway node(s) 518. As an example, in a 3GPP UMTS network, CS gateway node(s) 512 can be realized at least in part in gateway GPRS support node(s) (GGSN). It should be appreciated that functionality and specific operation of CS gateway node(s) 512, PS gateway node(s) 518, and serving node(s) 516, is provided and dictated by radio technology(ies) utilized by mobile network platform 510 for telecommunication over a radio access network 520 with other devices, such as a radiotelephone 575.

In addition to receiving and processing CS-switched traffic and signaling, PS gateway node(s) 518 can authorize and authenticate PS-based data sessions with served mobile devices. Data sessions can comprise traffic, or content(s), exchanged with networks external to the mobile network platform 510, like wide area network(s) (WANs) 550, enterprise network(s) 570, and service network(s) 580, which can be embodied in local area network(s) (LANs), can also be interfaced with mobile network platform 510 through PS gateway node(s) 518. It is to be noted that WANs 550 and enterprise network(s) 570 can embody, at least in part, a service network(s) like IP multimedia subsystem (IMS). Based on radio technology layer(s) available in technology resource(s) or radio access network 520, PS gateway node(s) 518 can generate packet data protocol contexts when a data session is established; other data structures that facilitate routing of packetized data also can be generated. To that end, in an aspect, PS gateway node(s) 518 can comprise a tunnel interface (e.g., tunnel termination gateway (TTG) in 3GPP UMTS network(s) (not shown)) which can facilitate packetized communication with disparate wireless network(s), such as Wi-Fi networks.

In embodiment 500, mobile network platform 510 also comprises serving node(s) 516 that, based upon available radio technology layer(s) within technology resource(s) in the radio access network 520, convey the various packetized flows of data streams received through PS gateway node(s) 518. It is to be noted that for technology resource(s) that rely primarily on CS communication, server node(s) can deliver traffic without reliance on PS gateway node(s) 518; for example, server node(s) can embody at least in part a mobile switching center. As an example, in a 3GPP UMTS network, serving node(s) 516 can be embodied in serving GPRS support node(s) (SGSN).

For radio technologies that exploit packetized communication, server(s) 514 in mobile network platform 510 can execute numerous applications that can generate multiple disparate packetized data streams or flows, and manage (e.g., schedule, queue, format . . . ) such flows. Such application(s) can comprise add-on features to standard services (for example, provisioning, billing, customer support . . . ) provided by mobile network platform 510. Data streams (e.g., content(s) that are part of a voice call or data session) can be conveyed to PS gateway node(s) 518 for authorization/authentication and initiation of a data session, and to serving node(s) 516 for communication thereafter. In addition to application server, server(s) 514 can comprise utility server(s), a utility server can comprise a provisioning server, an operations and maintenance server, a security server that can implement at least in part a certificate authority and firewalls as well as other security mechanisms, and the like. In an aspect, security server(s) secure communication served through mobile network platform 510 to ensure network's operation and data integrity in addition to authorization and authentication procedures that CS gateway node(s) 512 and PS gateway node(s) 518 can enact. Moreover, provisioning server(s) can provision services from external network(s) like networks operated by a disparate service provider; for instance, WAN 550 or Global Positioning System (GPS) network(s) (not shown). Provisioning server(s) can also provision coverage through networks associated to mobile network platform 510 (e.g., deployed and operated by the same service provider), such as the distributed antennas networks shown in FIG. 1(s) that enhance wireless service coverage by providing more network coverage.

It is to be noted that server(s) 514 can comprise one or more processors configured to confer at least in part the functionality of mobile network platform 510. To that end, the one or more processor can execute code instructions stored in memory 530, for example. It is should be appreciated that server(s) 514 can comprise a content manager, which operates in substantially the same manner as described hereinbefore.

In example embodiment 500, memory 530 can store information related to operation of mobile network platform 510. Other operational information can comprise provisioning information of mobile devices served through mobile network platform 510, subscriber databases; application intelligence, pricing schemes, e.g., promotional rates, flat-rate programs, couponing campaigns; technical specification(s) consistent with telecommunication protocols for operation of disparate radio, or wireless, technology layers; and so forth. Memory 530 can also store information from at least one of telephony network(s) 540, WAN 550, SS7 network 560, or enterprise network(s) 570. In an aspect, memory 530 can be, for example, accessed as part of a data store component or as a remotely connected memory store.

In order to provide a context for the various aspects of the disclosed subject matter, FIG. 5, and the following discussion, are intended to provide a brief, general description of a suitable environment in which the various aspects of the disclosed subject matter can be implemented. While the subject matter has been described above in the general context of computer-executable instructions of a computer program that runs on a computer and/or computers, those skilled in the art will recognize that the disclosed subject matter also can be implemented in combination with other program modules. Generally, program modules comprise routines, programs, components, data structures, etc., that perform particular tasks and/or implement particular abstract data types.

Figure 6:
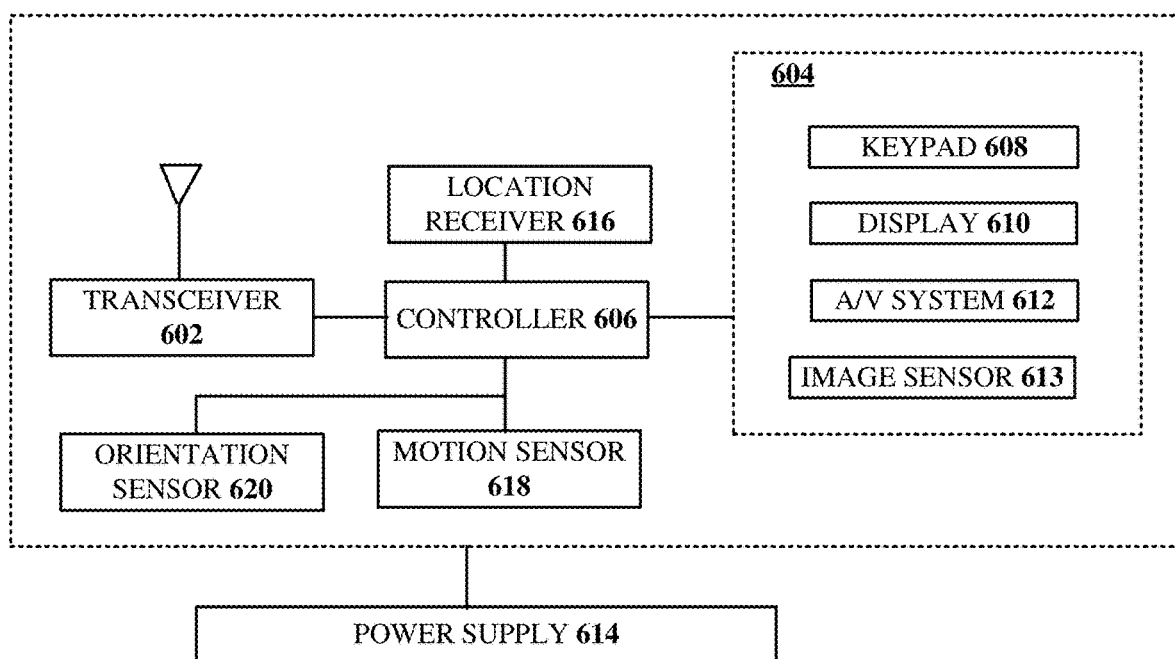
FIG. 6 is a block diagram of an example, non-limiting embodiment of a communication device in accordance with various aspects described herein.

Turning now to FIG. 6, an illustrative embodiment of a communication device 600 is shown. The communication device 600 can serve as an illustrative embodiment of devices such as data terminals 114, mobile devices 124, vehicle 126, display devices 144 or other client devices for communication via either communications network 125. For example, computing device 600 can facilitate in whole or in part a simplified processing of received channel-encoded data blocks under certain favorable conditions. For example, information bits can be extracted from a received channel-encoded data block without requiring any decoding, responsive to a favorable error check result, e.g., a favorable CRC, of the received channel-encoded data block. In at least some embodiments, a channel decoder is temporarily disabled responsive to a determination that systematic channel encoding was applied to the data block prior to transmission, and upon a favorable error check of the received channel-encoded data block.

The communication device 600 can comprise a wireline and/or wireless transceiver 602 (herein transceiver 602), a user interface (UI) 604, a power supply 614, a location receiver 616, a motion sensor 618, an orientation sensor 620, and a controller 606 for managing operations thereof. The transceiver 602 can support short-range or long-range wireless access technologies such as Bluetooth®, ZigBee®, WiFi, DECT, or cellular communication technologies, just to mention a few (Bluetooth® and ZigBee® are trademarks registered by the Bluetooth® Special Interest Group and the ZigBee® Alliance, respectively). Cellular technologies can include, for example, CDMA-1X, UMTS/HSDPA, GSM/GPRS, TDMA/EDGE, EV/DO, WiMAX, SDR, LTE, as well as other next generation wireless communication technologies as they arise. The transceiver 602 can also be adapted to support circuit-switched wireline access technologies (such as PSTN), packet-switched wireline access technologies (such as TCP/IP, VoIP, etc.), and combinations thereof.

The UI 604 can include a depressible or touch-sensitive keypad 608 with a navigation mechanism such as a roller ball, a joystick, a mouse, or a navigation disk for manipulating operations of the communication device 600. The keypad 608 can be an integral part of a housing assembly of the communication device 600 or an independent device operably coupled thereto by a tethered wireline interface (such as a USB cable) or a wireless interface supporting for example Bluetooth®. The keypad 608 can represent a numeric keypad commonly used by phones, and/or a QWERTY keypad with alphanumeric keys. The UI 604 can further include a display 610 such as monochrome or color LCD (Liquid Crystal Display), OLED (Organic Light Emitting Diode) or other suitable display technology for conveying images to an end user of the communication device 600. In an embodiment where the display 610 is touch-sensitive, a portion or all of the keypad 608 can be presented by way of the display 610 with navigation features.

The display 610 can use touch screen technology to also serve as a user interface for detecting user input. As a touch screen display, the communication device 600 can be adapted to present a user interface having graphical user interface (GUI) elements that can be selected by a user with a touch of a finger. The display 610 can be equipped with capacitive, resistive or other forms of sensing technology to detect how much surface area of a user's finger has been placed on a portion of the touch screen display. This sensing information can be used to control the manipulation of the GUI elements or other functions of the user interface. The display 610 can be an integral part of the housing assembly of the communication device 600 or an independent device communicatively coupled thereto by a tethered wireline interface (such as a cable) or a wireless interface.

The UI 604 can also include an audio system 612 that utilizes audio technology for conveying low volume audio (such as audio heard in proximity of a human ear) and high volume audio (such as speakerphone for hands free operation). The audio system 612 can further include a microphone for receiving audible signals of an end user. The audio system 612 can also be used for voice recognition applications. The UI 604 can further include an image sensor 613 such as a charged coupled device (CCD) camera for capturing still or moving images.

The power supply 614 can utilize common power management technologies such as replaceable and rechargeable batteries, supply regulation technologies, and/or charging system technologies for supplying energy to the components of the communication device 600 to facilitate long-range or short-range portable communications. Alternatively, or in combination, the charging system can utilize external power sources such as DC power supplied over a physical interface such as a USB port or other suitable tethering technologies.

The location receiver 616 can utilize location technology such as a global positioning system (GPS) receiver capable of assisted GPS for identifying a location of the communication device 600 based on signals generated by a constellation of GPS satellites, which can be used for facilitating location services such as navigation. The motion sensor 618 can utilize motion sensing technology such as an accelerometer, a gyroscope, or other suitable motion sensing technology to detect motion of the communication device 600 in three-dimensional space. The orientation sensor 620 can utilize orientation sensing technology such as a magnetometer to detect the orientation of the communication device 600 (north, south, west, and east, as well as combined orientations in degrees, minutes, or other suitable orientation metrics).

The communication device 600 can use the transceiver 602 to also determine a proximity to a cellular, WiFi, Bluetooth®, or other wireless access points by sensing techniques such as utilizing a received signal strength indicator (RSSI) and/or signal time of arrival (TOA) or time of flight (TOF) measurements. The controller 606 can utilize computing technologies such as a microprocessor, a digital signal processor (DSP), programmable gate arrays, application specific integrated circuits, and/or a video processor with associated storage memory such as Flash, ROM, RAM, SRAM, DRAM or other storage technologies for executing computer instructions, controlling, and processing data supplied by the aforementioned components of the communication device 600.

Other components not shown in FIG. 6 can be used in one or more embodiments of the subject disclosure. For instance, the communication device 600 can include a slot for adding or removing an identity module such as a Subscriber Identity Module (SIM) card or Universal Integrated Circuit Card (UICC). SIM or UICC cards can be used for identifying subscriber services, executing programs, storing subscriber data, and so on.

Note that the illustrative examples provided are primarily directed to downlink transmissions. However, the same or similar principles can be applied to virtually any other communication channels, e.g., including uplink and/or sidelink channels.

Also note that although the illustrative examples primarily include using New Radio (NR) LDPC codes, it is understood that the same or similar principles can be used for any code that transports the information with other bits, such as parity bits. For example, the techniques disclosed herein can be applied to systems that uses systematic error correction codes.

The terms "first," "second," "third," and so forth, as used in the claims, unless otherwise clear by context, is for clarity only and doesn't otherwise indicate or imply any order in time. For instance, "a first determination," "a second determination," and "a third determination," does not indicate or imply that the first determination is to be made before the second determination, or vice versa, etc.

In the subject specification, terms such as "store," "storage," "data store," data storage," "database," and substantially any other information storage component relevant to operation and functionality of a component, refer to "memory components," or entities embodied in a "memory" or components comprising the memory. It will be appreciated that the memory components described herein can be either volatile memory or nonvolatile memory, or can comprise both volatile and nonvolatile memory, by way of illustration, and not limitation, volatile memory, non-volatile memory, disk storage, and memory storage. Further, non-volatile memory can be included in read only memory (ROM), programmable ROM (PROM), electrically programmable ROM (EPROM), electrically erasable ROM (EEPROM), or flash memory. Volatile memory can comprise random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Additionally, the disclosed memory components of systems or methods herein are intended to comprise, without being limited to comprising, these and any other suitable types of memory.

Moreover, it will be noted that the disclosed subject matter can be practiced with other computer system configurations, comprising single-processor or multiprocessor computer systems, mini-computing devices, mainframe computers, as well as personal computers, hand-held computing devices (e.g., PDA, phone, smartphone, watch, tablet computers, netbook computers, etc.), microprocessor-based or programmable consumer or industrial electronics, and the like. The illustrated aspects can also be practiced in distributed computing environments where tasks are performed by remote processing devices that are linked through a communications network; however, some if not all aspects of the subject disclosure can be practiced on stand-alone computers. In a distributed computing environment, program modules can be located in both local and remote memory storage devices.

In one or more embodiments, information regarding use of services can be generated including services being accessed, media consumption history, user preferences, and so forth. This information can be obtained by various methods including user input, detecting types of communications (e.g., video content vs. audio content), analysis of content streams, sampling, and so forth. The generating, obtaining and/or monitoring of this information can be responsive to an authorization provided by the user. In one or more embodiments, an analysis of data can be subject to authorization from user(s) associated with the data, such as an opt-in, an opt-out, acknowledgement requirements, notifications, selective authorization based on types of data, and so forth.

Some of the embodiments described herein can also employ artificial intelligence (AI) to facilitate automating one or more features described herein. The embodiments (e.g., in connection with automatically identifying acquired cell sites that provide a maximum value/benefit after addition to an existing communication network) can employ various AI-based schemes for carrying out various embodiments thereof. Moreover, the classifier can be employed to determine a ranking or priority of each cell site of the acquired network. A classifier is a function that maps an input attribute vector, $x=(x1, x2, x3, x4, \ldots, xn)$, to a confidence that the input belongs to a class, that is, $f(x)$ =confidence(class). Such classification can employ a probabilistic and/or statistical-based analysis (e.g., factoring into the analysis utilities and costs) to determine or infer an action that a user desires to be automatically performed. A support vector machine (SVM) is an example of a classifier that can be employed. The SVM operates by finding a hypersurface in the space of possible inputs, which the hypersurface attempts to split the triggering criteria from the non-triggering events. Intuitively, this makes the classification correct for testing data that is near, but not identical to training data. Other directed and undirected model classification approaches comprise, e.g., naïve Bayes, Bayesian networks, decision trees, neural networks, fuzzy logic models, and probabilistic classification models providing different patterns of independence can be employed. Classification as used herein also is inclusive of statistical regression that is utilized to develop models of priority.

As will be readily appreciated, one or more of the embodiments can employ classifiers that are explicitly trained (e.g., via a generic training data) as well as implicitly trained (e.g., via observing UE behavior, operator preferences, historical information, receiving extrinsic information). For example, SVMs can be configured via a learning or training phase within a classifier constructor and feature selection module. Thus, the classifier(s) can be used to automatically learn and perform a number of functions, including but not limited to determining according to predetermined criteria which of the acquired cell sites will benefit a maximum number of subscribers and/or which of the acquired cell sites will add minimum value to the existing communication network coverage, etc.

As used in some contexts in this application, in some embodiments, the terms "component," "system" and the like are intended to refer to, or comprise, a computer-related entity or an entity related to an operational apparatus with one or more specific functionalities, wherein the entity can be either hardware, a combination of hardware and software, software, or software in execution. As an example, a component may be, but is not limited to being, a process running on a processor, a processor, an object, an executable, a thread of execution, computer-executable instructions, a program, and/or a computer. By way of illustration and not limitation, both an application running on a server and the server can be a component. One or more components may reside within a process and/or thread of execution and a component may be localized on one computer and/or distributed between two or more computers. In addition, these components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor, wherein the processor can be internal or external to the apparatus and executes at least a part of the software or firmware application. As yet another example, a component can be an apparatus that provides specific functionality through electronic components without mechanical parts, the electronic components can comprise a processor therein to execute software or firmware that confers at least in part the functionality of the electronic components. While various components have been illustrated as separate components, it will be appreciated that multiple components can be implemented as a single component, or a single component can be implemented as multiple components, without departing from example embodiments.

Further, the various embodiments can be implemented as a method, apparatus or article of manufacture using standard programming and/or engineering techniques to produce software, firmware, hardware or any combination thereof to control a computer to implement the disclosed subject matter. The term "article of manufacture" as used herein is intended to encompass a computer program accessible from any computer-readable device or computer-readable storage/communications media. For example, computer readable storage media can include, but are not limited to, magnetic storage devices (e.g., hard disk, floppy disk, magnetic strips), optical disks (e.g., compact disk (CD), digital versatile disk (DVD)), smart cards, and flash memory devices (e.g., card, stick, key drive). Of course, those skilled in the art will recognize many modifications can be made to this configuration without departing from the scope or spirit of the various embodiments.

In addition, the words "example" and "exemplary" are used herein to mean serving as an instance or illustration. Any embodiment or design described herein as "example" or "exemplary" is not necessarily to be construed as preferred or advantageous over other embodiments or designs. Rather, use of the word example or exemplary is intended to present concepts in a concrete fashion. As used in this application, the term "or" is intended to mean an inclusive "or" rather than an exclusive "or". That is, unless specified otherwise or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Moreover, terms such as "user equipment," "mobile station," "mobile," subscriber station," "access terminal," "terminal," "handset," "mobile device" (and/or terms representing similar terminology) can refer to a wireless device utilized by a subscriber or user of a wireless communication service to receive or convey data, control, voice, video, sound, gaming or substantially any data-stream or signaling-stream. The foregoing terms are utilized interchangeably herein and with reference to the related drawings.

Furthermore, the terms "user," "subscriber," "customer," "consumer" and the like are employed interchangeably throughout, unless context warrants particular distinctions among the terms. It should be appreciated that such terms can refer to human entities or automated components supported through artificial intelligence (e.g., a capacity to make inference based, at least, on complex mathematical formalisms), which can provide simulated vision, sound recognition and so forth.

As employed herein, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components or any combination thereof designed to perform the functions described herein. Processors can exploit nano-scale architectures such as, but not limited to, molecular and quantum-dot based transistors, switches and gates, in order to optimize space usage or enhance performance of user equipment. A processor can also be implemented as a combination of computing processing units.

As used herein, terms such as "data storage," data storage," "database," and substantially any other information storage component relevant to operation and functionality of a component, refer to "memory components," or entities embodied in a "memory" or components comprising the memory. It will be appreciated that the memory components or computer-readable storage media, described herein can be either volatile memory or nonvolatile memory or can include both volatile and nonvolatile memory.

What has been described above includes mere examples of various embodiments. It is, of course, not possible to describe every conceivable combination of components or methodologies for purposes of describing these examples, but one of ordinary skill in the art can recognize that many further combinations and permutations of the present embodiments are possible. Accordingly, the embodiments disclosed and/or claimed herein are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

As may also be used herein, the term(s) "operably coupled to", "coupled to", and/or "coupling" includes direct coupling between items and/or indirect coupling between items via one or more intervening items. Such items and intervening items include, but are not limited to, junctions, communication paths, components, circuit elements, circuits, functional blocks, and/or devices. As an example of indirect coupling, a signal conveyed from a first item to a second item may be modified by one or more intervening items by modifying the form, nature or format of information in a signal, while one or more elements of the information in the signal are nevertheless conveyed in a manner than can be recognized by the second item. In a further example of indirect coupling, an action in a first item can cause a reaction on the second item, as a result of actions and/or reactions in one or more intervening items.

Although specific embodiments have been illustrated and described herein, it should be appreciated that any arrangement which achieves the same or similar purpose may be substituted for the embodiments described or shown by the subject disclosure. The subject disclosure is intended to cover any and all adaptations or variations of various embodiments. Combinations of the above embodiments, and other embodiments not specifically described herein, can be used in the subject disclosure. For instance, one or more features from one or more embodiments can be combined with one or more features of one or more other embodiments. In one or more embodiments, features that are positively recited can also be negatively recited and excluded from the embodiment with or without replacement by another structural and/or functional feature. The steps or functions described with respect to the embodiments of the subject disclosure can be performed in any order. The steps or functions described with respect to the embodiments of the subject disclosure can be performed alone or in combination with other steps or functions of the subject disclosure, as well as from other embodiments or from other steps that have not been described in the subject disclosure. Further, more than or less than all of the features described with respect to an embodiment can also be utilized.

What is claimed is:

1. A method, comprising:
   receiving, by a processing system including a processor, a channel encoded data block transmitted via a communication channel, wherein the channel encoded data block comprises information bits, a transmitted error_check value, and redundant code bits, wherein the redundant code bits correspond to a systematic channel code applied to the channel encoded data block prior to transmission via the communication channel;
   determining, by the processing system, that a link characteristic of the communication channel exceeds a threshold; and
   responsive to the determination that the link characteristic exceeds the threshold, obtaining, by the processing system, the information bits and the transmitted error check value from the channel encoded data block without decoding the channel encoded data block according to the systematic channel code.

2. The method of claim 1, wherein the systematic channel code comprises a low-density parity check code (LDPC).

3. The method of claim 2, wherein the transmitted error_check value comprises a cyclic redundancy check (CRC) code.

4. The method of claim 3, wherein the obtaining of the information bits without decoding the channel encoded data block, further comprises extracting, by the processing system, the information bits from the channel encoded data block.

5. The method of claim 3, wherein the link characteristic comprises a signal-to-interference-plus-noise ratio (SINR).

6. The method of claim 3, further comprising performing an error check of the channel encoded data block according to the transmitted error check value to obtain an error_check result.

7. The method of claim 6, further comprising obtaining, responsive to the error_check result not indicating an error, the information bits without decoding the channel encoded data block according to the systematic channel code.

8. The method of claim 1, wherein the obtaining of the information bits does not use the redundant code bits.

9. A device, comprising:
   a processing system including a processor; and
   a memory that stores executable instructions that, when executed by the processing system, facilitate performance of operations, the operations comprising:
      obtaining a received channel encoded data block transmitted via a communication channel, wherein the received channel encoded data block comprises information bits, a transmitted error_check value, and redundant code bits, wherein the redundant code bits correspond to a systematic channel code applied to the received channel encoded data block prior to transmission via the communication channel;
      determining that a link characteristic of the communication channel exceeds a threshold; and
      responsive to the determination that the link characteristic exceeds the threshold, obtaining the information bits and the transmitted error_check value from the received channel encoded data block without decoding the received channel encoded data block according to the systematic channel code.

10. The device of claim 9, wherein the systematic channel code comprises a low density parity check (LDPC) code.

11. The device of claim 9, wherein the link characteristic comprises a signal-to-interference-plus-noise ratio (SINR).

12. The device of claim 9, wherein the operations further comprise performing an error check of the received channel encoded data block according to the transmitted error_check value to obtain an error_check result.

13. The device of claim 12, wherein the operations further comprise obtaining, responsive to the error_check result not indicating an error, the information bits without decoding the received channel encoded data block according to the systematic channel code.

14. The device of claim 12, wherein the operations further comprise decoding, responsive to the error_check result indicating an error, the received channel encoded data block according to the systematic channel code to obtain decoded information bits.

15. The device of claim 9, wherein the transmitted error_check value comprises a cyclic redundancy check (CRC) code.

16. A non-transitory, machine-readable medium, comprising executable instructions that, when executed by a processing system including a processor, facilitate performance of operations, the operations comprising:

obtaining a received channel encoded data block transmitted via a communication channel, wherein the received channel encoded data block comprises information bits, a transmitted error_check value, and redundant code bits, wherein the redundant code bits correspond to a systematic channel code applied to the received channel encoded data block prior to transmission via the communication channel;

determining that a link characteristic of the communication channel exceeds a threshold; and responsive to the determination that the link characteristic exceeds the threshold, obtaining the information bits and the transmitted error_check value from the received channel encoded data block without decoding the received channel encoded data block according to the systematic channel code.

17. The non-transitory, machine-readable medium of claim 16, wherein the operations further comprise:

performing an error check of the received channel encoded data block according to the transmitted error_check value to obtain an error_check result.

18. The non-transitory, machine-readable medium of claim 17, wherein the operations further comprise:

decoding, responsive to the error_check result, the received channel encoded data block according to the systematic channel code to obtain decoded information bits.

19. The non-transitory, machine-readable medium of claim 16, wherein the systematic channel code comprises a low density parity check (LDPC) code.

20. The non-transitory, machine-readable medium of claim 16, wherein the link characteristic comprises a signal-to-interference-plus-noise ratio (SINR).

* * * * *